(12) United States Patent
Nguyen et al.

(10) Patent No.: US 9,434,129 B2
(45) Date of Patent: *Sep. 6, 2016

(54) DRY ADHESIVES

(71) Applicant: Mylan Group, Tra Vinh Province (VN)

(72) Inventors: My T. Nguyen, Kirkland (CA); Loc Vinh Bui, Moorpark, CA (US)

(73) Assignee: MYLAN GROUP, Tra Vinh, Tra Vinh Province (VN)

( * ) Notice: Subject to any disclaimer, the term of this patent is extended or adjusted under 35 U.S.C. 154(b) by 171 days.

This patent is subject to a terminal disclaimer.

(21) Appl. No.: 13/962,207

(22) Filed: Aug. 8, 2013

(65) Prior Publication Data

US 2014/0044920 A1  Feb. 13, 2014

Related U.S. Application Data

(63) Continuation of application No. 13/465,706, filed on May 7, 2012.

(60) Provisional application No. 61/485,700, filed on May 13, 2011, provisional application No. 61/486,382, filed on May 16, 2011, provisional application No. 61/486,951, filed on May 17, 2011, provisional application No. 61/499,864, filed on Jun. 22, 2011, provisional application No. 61/566,777, filed on Dec. 5, 2011.

(51) Int. Cl.
*B32B 3/30* (2006.01)
*C09J 7/00* (2006.01)
*B32B 3/00* (2006.01)
(Continued)

(52) U.S. Cl.
CPC . *B32B 3/30* (2013.01); *B32B 3/00* (2013.01); *B32B 27/10* (2013.01); *B32B 27/36* (2013.01); *C09J 7/00* (2013.01); *C09J 109/06* (2013.01); *C09J 153/02* (2013.01); *C09J 183/04* (2013.01); *B32B 2255/10* (2013.01); *B32B 2255/26* (2013.01); *B81B 1/002* (2013.01); *B81B 2203/0315* (2013.01); *B82Y 30/00* (2013.01);
(Continued)

(58) Field of Classification Search
CPC ................. C09J 2201/626; B81B 2203/0315; F16B 2/005
USPC .................................. 428/141, 156; 977/724
See application file for complete search history.

(56) References Cited

U.S. PATENT DOCUMENTS 4,587,152 A   5/1986   Gleichenhagen et al.
5,421,953 A   6/1995   Nagakubo et al.
(Continued)

FOREIGN PATENT DOCUMENTS

CN   101774528 A   7/2010
JP   H06269307 A   9/1994
(Continued)

OTHER PUBLICATIONS

NPL on Silicone Elastomer from Dow Corning, retrieved on Dec. 16, 2015.*
(Continued)

*Primary Examiner* — Aaron Austin
*Assistant Examiner* — Zheren J Yang
(74) *Attorney, Agent, or Firm* — Lathrop & Gage LLP; Brian C. Trinque

(57) ABSTRACT

A dry adhesive comprising a micro-featured and nano-featured surface, and a compliant surface having a hardness of about 60 Shore A or less, the micro-featured and nano-featured surface and the compliant surface being capable of forming upon contact a dry adhesive bond with each other.

25 Claims, 20 Drawing Sheets

(51) Int. Cl.
*C09J 109/06* (2006.01)
*C09J 183/04* (2006.01)
*B32B 27/10* (2006.01)
*B32B 27/36* (2006.01)
*C09J 153/02* (2006.01)
*B81B 1/00* (2006.01)
*B82Y 30/00* (2011.01)

(52) U.S. Cl.
CPC ... *C09J 2201/626* (2013.01); *Y10T 428/24355* (2015.01); *Y10T 428/24479* (2015.01)

(56) References Cited

U.S. PATENT DOCUMENTS

| | | | |
|---|---|---|---|
| 6,291,127 B1 * | 9/2001 | Dagan | G03C 1/79 162/136 |
| 6,434,897 B1 | 8/2002 | Sievers et al. | |
| 6,770,592 B2 * | 8/2004 | Suzuki | B41M 5/42 503/200 |
| 7,695,811 B2 | 4/2010 | Northern et al. | |
| 2004/0218917 A1 * | 11/2004 | Mizutani | B41J 2/32 396/322 |
| 2005/0119640 A1 | 6/2005 | Sverduk et al. | |
| 2005/0148984 A1 * | 7/2005 | Lindsay | A61F 13/5611 604/387 |
| 2005/0181170 A1 * | 8/2005 | Fearing | A44B 18/0003 428/85 |
| 2006/0131265 A1 | 6/2006 | Samper et al. | |
| 2006/0181592 A1 * | 8/2006 | Gandasasmita | B41M 5/502 347/106 |
| 2007/0148409 A1 * | 6/2007 | Rios | A43B 13/22 428/167 |
| 2008/0014140 A1 | 1/2008 | Christensen et al. | |
| 2008/0070001 A1 * | 3/2008 | Lasarov | B29C 45/1418 428/141 |
| 2008/0169059 A1 | 7/2008 | Messersmith et al. | |
| 2009/0130372 A1 | 5/2009 | Fukui | |
| 2010/0040833 A1 * | 2/2010 | Quartarone | F16D 3/50 428/156 |
| 2010/0062208 A1 | 3/2010 | Majidi et al. | |
| 2010/0136281 A1 | 6/2010 | Sitti et al. | |
| 2010/0190011 A1 | 7/2010 | Cheng et al. | |
| 2011/0104430 A1 | 5/2011 | Mehrabi et al. | |
| 2012/0216949 A1 * | 8/2012 | Carey Stachowski | C08L 75/04 156/247 |
| 2012/0258287 A1 * | 10/2012 | Arzt | C09J 7/00 428/172 |

FOREIGN PATENT DOCUMENTS

| | | |
|---|---|---|
| JP | H09270177 A | 10/1997 |
| JP | 2002038112 A | 2/2002 |
| JP | 2003076308 A | 3/2003 |
| JP | 2003165051 A | 6/2003 |
| JP | 2007316984 A | 12/2007 |
| JP | 2010217504 A | 9/2010 |
| JP | U3167449 | 4/2011 |
| WO | WO 00/77118 A1 | 12/2000 |
| WO | WO2005/033237 A2 | 4/2005 |
| WO | WO2006/060149 A2 | 6/2006 |
| WO | WO2007/061854 A2 | 5/2007 |
| WO | 2007075802 A2 | 7/2007 |
| WO | WO2008/076390 A2 | 6/2008 |
| WO | WO2011/021591 A1 | 2/2011 |

OTHER PUBLICATIONS

International Search Report and Written Opinion, PCT/CA2012/05101, dated May 23, 2012.
Extended European Search Report, EP12167778, dated Jun. 28, 2012.
Extended European Search Report, EP12167775, dated Sep. 19, 2012.
Extended European Search Report, EP12167776, dated Sep. 20, 2012.
"Shore Harte," Reifen Haub Lexikon, Nov. 30, 2011, retrieved from Internet: url:http://www.reifen-haub.de/lexikon/?tx__indislexikon__pil[showUid]=69&cHash=a883fcd761, (downloaded Sep. 7, 2012).
Yang et al.: Hierarchically structured functional materials: Synthesis strategies for multimodal porousnetworks; Pure Appl. Chem.; 2009, vol. 81, pp. 2265-2307.

* cited by examiner

DRY ADHESIVES

CROSS REFERENCE TO RELATED APPLICATIONS

This application is a continuation of U.S. Ser. No. 13/465,706 filed May 7, 2012, which claims benefit, under 35 U.S.C. §119(e), of the following U.S. provisional applications:

U.S. provisional application Ser. No. 61/485,700, filed on May 13, 2011,

U.S. provisional application Ser. No. 61/486,382, filed on May 16, 2011,

U.S. provisional application Ser. No. 61/486,951, filed on May 17, 2011,

U.S. provisional application Ser. No. 61/499,864, filed on Jun. 22, 2011, and

U.S. provisional application Ser. No. 61/566,777, filed on Dec. 5, 2011, and of international patent application PCT CA2012/050101, filed on Feb. 21, 2012.

All documents above are incorporated herein in their entirety by reference.

FIELD OF THE INVENTION

The present invention relates to dry adhesives.

BACKGROUND OF THE INVENTION

Metals, glass, and plastics are common fabrication materials used in many commercial and industrial applications. The surfaces of these materials have a wide range of finishes. The finish of these surfaces defines the texture of the material, which ranges from a highly polished surface to a visually and/or tactilely rough surface. Further, the aforementioned materials are non-tacky (i.e. non adhesive) and require the use of an adhesive to adhere one surface of the material to the other.

Inspired by the ability of the gecko to adhere to most surfaces at any angle, attempts at developing dry adhesives mimicking the spatula tipped setae on the gecko feet pads have been carried out at many institutions. Geckos can instantaneously and repeatedly attach and detach their fibrillar feet pads to a wide range of surfaces without leaving residues. Typical approaches to produce such a dry adhesive have consisted in designing and fabricating synthetic gecko setae. However, the gecko's setae have a complicated branched structure. A single gecko may have two millions setae on its feet. Each seta may branch into hundreds of spatula-shape tips. These spatula-shape tips are about 200 nanometers in diameter. It is believed that the adhesive force of the gecko feet pads results from the cumulative effect of van der Waals forces between the millions of setae on the feet pads in intimate contact with the surface the gecko is climbing on.

On another subject, inkjet printers have become ubiquitous and an indispensable tool in homes and small offices. Inexpensive inkjet printers typically employ water-based inks to print on uncoated or coated paper. The quality of images printed on coated paper with an inkjet printer has exceeded the visual threshold and can thus compete with photographic silver halide processes.

However, there are a number of problems and/or disadvantages associated water-based inks. A first problem is that these inks are water soluble. Therefore, the images printed with such inks may not be waterfast. A small drop of water can cause severe smearing of the information on the printed image. The smeared image may often be irrecoverably damaged and/or information on the image may be permanently lost.

Another problem associated with images printed with inkjet printers is archival. Images printed with inkjet printers have a limited lifetime due to low lightfastness of the inks involved. Dye based inks tend to fade in a relatively short time. Further, each color has a tendency to fade at a different rate leading to a change in the image color balance.

In the prior art, waterfastness and/or lightfastness have been improved by using solvent based inks. Such inks are not water soluble, and the images they produce thus tend to be waterfast and lightfast. However, the main components in solvent ink are volatile organic compounds (VOC). These VOCs make these inks less environmentally friendly.

A more environmentally friendly solution is to laminate a protective film over the printed image. Laminating films are available as thermally activated film and/or pressure sensitive, heatless film. Thermally activated films typically contain a heat-activated adhesive and are applied using a heated roll laminator to irreversibly bond the film to the substrate. In such hot melt lamination processes, the thickness of the laminating film is limited by heat transfer constraints. This is because polymers used to make these films typically are thermal insulators that do not conduct heat very well. Thus the thickness of the film will be limited as only films that are thin enough to allow sufficient heat transfer to melt the adhesive layer can be used. Pressure sensitive film contains a pressure sensitive adhesive (glue) that is protected with a backing film that does not adhere to the glue. When the backing film is removed, the pressure sensitive adhesive layer is applied with a cold roll laminator to irreversibly bond to the film to the substrate via the glue.

A disadvantage of such laminating films is that complex laminating equipments is typically required to apply the required heat and/or pressure in order to adhere the laminating film to the printed image. Further, the bond between the printed image and laminating film is generally permanent and thus the laminating film may not be readjusted or removed once the lamination process is completed.

The present description refers to a number of documents, the content of which is herein incorporated by reference in their entirety.

SUMMARY OF THE INVENTION

In accordance with the present invention, there is provided:

1. A dry adhesive comprising:
    a. a micro-featured and nano-featured surface, and
    b. a compliant surface having a hardness of about 60 Shore A or less,
    the micro-featured and nano-featured surface and the compliant surface being capable of forming upon contact a dry adhesive bond with each other.
2. The dry adhesive of item 1, wherein the compliant surface has a hardness of about 55, 50, 45, 40, 35, 30, 25, 20 Shore A or less.
3. The dry adhesive of item 1 or 2, wherein the compliant surface is a surface of an object made of a compliant material.
4. The dry adhesive of item 1 or 2, wherein the compliant surface is a layer of a compliant material alone or on a support.

5. The dry adhesive of item 1 or 2, wherein the compliant surface is comprised of spots of a compliant material on a support.
6. The dry adhesive of item 4 or 5, wherein the support has a polymeric surface, such as a surface made of PET, a paper surface, a metallic surface.
7. The dry adhesive of item 5, wherein the support is the micro-featured and nano-featured surface, the dry adhesive thereby being self-adhesive.
8. The dry adhesive of any one of items 3 to 7, wherein the compliant material is a polymer.
9. The dry adhesive of item 8, wherein the polymer is a thermoplastic elastomer or a crosslinked elastomer.
10. The dry adhesive of item 9, wherein the polymer is a silicon elastomer, a silicon rubber, a styrene-isoprene elastomer, a styrene-butadiene elastomer, a styrene-ethylene/butylene-styrene elastomer, a styrene-ethylene/propylene-styrene elastomer, an ethylene-butadiene-styrene elastomer, a siloxane polymer, or a poly-isocyanate.
11. The dry adhesive of any one of items 1 to 10, wherein the compliant surface and/or the micro-featured and nano-featured are backed with a conventional adhesive.
12. The dry adhesive of any one of items 1 to 11, wherein the micro-featured and nano-featured surface has a roughness average in amplitude ($R_a$) ranging between about 0.2 µm and about 3.0 µm, between about 0.2 µm and about 1.5 µm, between about 0.25 µm and about 1.5 µm or between about 0.2 µm and about 0.7 µm.
13. The dry adhesive of any one of items 1 to 12, wherein the micro-featured and nano-featured surface has a mean spacing of profile irregularities ($RS_m$) between about 20 µm and about 2000 µm, between about 20 µm and about 1500 µm, between about 20 µm and about 1000 µm or between about 20 µm and about 500 µm.
14. The dry adhesive of any one of items 1 to 13, wherein the micro-featured and nano-featured surface is a metallic surface, a glass surface, a paper surface, or a polymeric surface, the metallic surface, glass surface, paper surface and polymeric surface bearing micro-features and nano-features.
15. The dry adhesive of any one of items 1 to 13, wherein the micro-featured and nano-featured surface is comprised of micro-featured and nano-featured spots on a support.
16. The dry adhesive of item 15, wherein the support has a metallic surface, a glass surface, a paper surface, a polymeric surface.
17. The dry adhesive of item 16, wherein the support is made of aluminum.
18. The dry adhesive of item 16, wherein the support is an inkjet photo paper.
19. The dry adhesive of item 16, wherein the support is a polyethylene phthalate or a vinyl sheet, such as a PVC sheet.
20. The dry adhesive of any one of items 1 to 6 and 8 to 13, wherein the micro-featured and nano-featured surface is comprised of micro-featured and nano-featured spots on a support, the support being the compliant surface, the dry adhesive thereby being self-adhesive.
21. The dry adhesive of any one of items 1, 2, 5, 6, 8 to 13, and 15-19, wherein the micro-featured and nano-featured surface is comprised of micro-featured and nano-featured spots deposited on a support and wherein the compliant surface is comprised of spots of a compliant material deposited elsewhere on said support, the dry adhesive thereby being self-adhesive.

22. The dry adhesive of item 21, wherein the support is a plastic surface, such as a surface of a PET film, a metal surface, or a paper surface that is optionally backed by a plastic layer.
23. A micro-featured and nano-featured surface for the dry adhesion of a compliant surface having a hardness of about 60 Shore A or less, the micro-featured and nano-featured surface being able to form upon contact a dry adhesive bond with the compliant surface.
24. The micro-featured and nano-featured surface of item 23, wherein the micro-featured and nano-featured is as defined in any one of items 1 and 11 to 19 and/or the compliant surface is as defined in any one of items 1 to 6 and 8 and 10.
25. A compliant surface having a hardness of about 60 Shore A or less for the dry adhesion of a micro-featured and nano-featured surface, the compliant surface being able to form upon contact a dry adhesive bond with the micro-featured and nano-featured surface.
26. The compliant surface of item 25, wherein the micro-featured and nano-featured is as defined in any one of items 1 and 11 to 19 and/or the compliant surface is as defined in any one of items 1 to 6 and 8 and 10.
27. Use of a micro-featured and nano-featured surface according to any one of items 1 and 11 to 19 as a substrate for the dry adhesion of a compliant surface according to any one of items 1 to 6 and 8 and 10.
28. Use of a compliant surface according to any one of items 1 to 6 and 8 and 10 as a substrate for the dry adhesion of a micro-featured and nano-featured surface according to any one of items 1 and 11 to 19.
29. A dry self-adhesive comprising:
    a. a micro-featured and nano-featured surface, and
    b. a compliant surface having a hardness of about 60 Shore A or less,
the micro-featured and nano-featured surface and the compliant surface being capable of forming upon contact a dry adhesive bond with each other, wherein the micro-featured and nano-featured surface and the compliant surface each occupy one or more area(s) of a same physical surface.
30. The dry self-adhesive of item 29, wherein the micro-featured and nano-featured surface and the compliant surface each occupy one area of the same physical surface
31. The dry self-adhesive of item 29, wherein the micro-featured and nano-featured surface and the compliant surface each occupy multiples discrete areas of the same physical surface.
32. The dry self-adhesive of item 29 or 31, wherein the area(s) range(s) in size from about 1 µm to about 5 mm.
33. The dry self-adhesive of any one of item 29 to 32, comprising one or more compliant area(s) deposited on a micro-featured and nano-featured surface.
34. The dry self-adhesive of item 33, wherein the micro-featured and nano-featured surface is a metallic surface, a paper surface, or a polymeric surface.
35. The dry self-adhesive of item 33, wherein the metallic surface is an aluminum surface.
36. The dry self-adhesive of item 33, wherein the paper surface is an inkjet photo paper.
37. The dry self-adhesive of item 33, wherein the polymeric surface is a polyethylene phthalate or a vinyl surface, such as a PVC surface.
38. The dry self-adhesive of any one of items 33 to 37, comprising multiple discrete compliant areas spaced apart on the micro-featured and nano-featured surface.
39. The dry self-adhesive of item 38, where the ratio of the total area occupied by the compliant areas to the total area occupied by the micro-featured and nano-featured surface in the spaces between the compliant areas is 1:1.1 or more.
40. The dry self-adhesive of any one of item 29 to 32, comprising one or more micro-featured and nano-featured area(s) deposited on a compliant surface.
41. The dry self-adhesive of items 40, comprising multiple discrete micro-featured and nano-featured areas spaced apart on the compliant surface.
42. The dry self-adhesive of item 41, where the ratio of the total area occupied by the micro-featured and nano-featured areas to the total area occupied by the compliant surface in the spaces between the micro-featured and nano-featured areas is 1:1.1 or more.
43. The dry self-adhesive of any one of item 29 to 32, wherein one or more micro-featured and nano-featured area(s) and one or more compliant area(s) are deposited on a surface of a support.
44. The dry self-adhesive of item 43, wherein the surface of the support is a plastic surface, such as a surface of a PET film, a metal surface, or a paper surface that is optionally backed by a plastic layer.
45. The dry self-adhesive of any one of items 29 to 44, being backed with a conventional adhesive.
46. The dry self-adhesive of any one of items 29 to 45, wherein the compliant surface has a hardness of about 55, 50, 45, 40, 35, 30, 25, 20 Shore A or less.
47. The dry self-adhesive of any one of items 29 to 46, wherein the compliant surface comprises a polymer.
48. The dry self-adhesive of items 47, wherein the polymer comprised in the compliant surface is a thermoplastic elastomer or a crosslinked elastomer.
49. The dry self-adhesive of items 48, wherein the polymer comprised in the compliant surface is a silicon elastomer, a silicon rubber, a styrene-isoprene elastomer, a styrene-butadiene elastomer, a styrene-ethylene/butylene-styrene elastomer, a styrene-ethylene/propylene-styrene elastomer, an ethylene-butadiene-styrene elastomer, a siloxane polymer, or a poly-isocyanate.
50. The dry self-adhesive of any one of items 29 to 49, wherein the micro-featured and nano-featured surface has a roughness average in amplitude ($R_a$) ranging between about 0.2 μm and about 3.0 μm, between about 0.2 μm and about 1.5 μm, between about 0.25 μm and about 1.5 μm or between about 0.2 μm and about 0.7 μm.
51. The dry self-adhesive of any one of items 29 to 50, wherein the micro-featured and nano-featured surface has a mean spacing of profile irregularities ($RS_m$) between about 20 μm and about 2000 μm, between about 20 μm and about 1500 μm, between about 20 μm and about 1000 μm or between about 20 μm and about 500 μm.
52. A fastener comprising the dry adhesive according to any one items 1-22, a surface according to any one of items 23-26 or a dry self-adhesive according to any one of items 27-51.
53. A game or toy comprising the dry adhesive according to any one items 1-22, a surface according to any one of items 23-26 or a dry self-adhesive according to any one of items 57-51.
54. A board for displaying an advertisement having a compliant surface as defined in any one items 1-26 on its backside, the board having a micro-featured and nano-featured surface as defined in any one of items 1-26, the compliant surface being capable of forming upon contact a dry adhesive bond with the micro-featured and nano-featured surface.
55. The board of item 54, wherein the micro-featured and nano-featured surface is an aluminum surface.
56. The board of item 54 or 55, wherein the advertisement comprises a plastic sheet with an image and/or writings on its front and the compliant surface on its backside.
57. A board for mounting a display,
the board and the display each having a dry self-adhesive surface according to any one of items 27-51, or
the board comprising one of a compliant surface as defined in any one items 1-26 and a micro-featured and nano-featured surface according any one of items 1-26, and the display comprising the other of the compliant surface and the micro-featured and nano-featured surface.
58. A dart game comprising a target printed on a micro-featured and nano-featured surface according to any one of items 1-26 and one or more darts having a tip made of a compliant material and having a compliant surface according to any one of items 1-26.
59. A shooting game comprising a micro-featured and nano-featured surface according to any one of items 1-26 embedded in a piece of clothing and one or more projectiles having a compliant surface according to any one of items 1-26.
60. A laminating film for laminating a micro-featured and nano-featured surface, the laminating film having a compliant surface having a hardness of about 60 Shore A or less, the compliant surface being capable of forming upon contact a dry adhesive bond with the micro-featured and nano-featured surface.
61. The laminating film of item 60, wherein the compliant surface is a surface of a compliant layer located on a base layer.
62. The laminating film of item 60, wherein the compliant surface comprises spots of a compliant material deposited on a base layer.
63. The laminating film of item 61 or 62, wherein the base layer is a polymeric film, such as a PET film.
64. The laminating film of any one of items 60 to 63 wherein the compliant surface has a hardness of about 55, 50, 45, 40, 35, 30, 25, 20 Shore A or less.
65. The laminating film of any one of items 60 to 64, wherein the compliant surface comprises a polymer.
66. The laminating film of item 65, wherein the polymer comprised in the compliant surface is a thermoplastic elastomer or a crosslinked elastomer.
67. The laminating film of item 66, wherein the polymer comprised in the compliant surface is a silicon elastomer, a silicon rubber, a styrene-isoprene elastomer, a styrene-butadiene elastomer, a styrene-ethylene/butylene-styrene elastomer, a styrene-ethylene/propylene-styrene elastomer, an ethylene-butadiene-styrene elastomer, a siloxane polymer, or a poly-isocyanate.
68. The laminating film of any one of items 60 to 67, wherein the micro-featured and nano-featured surface is a paper surface.
69. The laminating film of item 68, wherein the paper surface is a surface of an inkjet photo paper.
70. A method of manufacturing a micro-featured and nano-featured surface, the method comprising creating micro-features and creating nano-features on the surface.
71. The method of item 70, wherein the micro-features are created by mechanical graining, chemical graining, electrolytic graining, plasma graining, by stretching a ductile material comprising nano additives or a combination thereof.

72. The method of item 70 or 71, wherein nano-features are created by electrolytic anodization, by incorporation of nano porous and/or nano particulate materials or by selective extraction of a phase in a phase separated material.

73. The method of any one of items 70 to 72, further comprising creating functional groups on the micro-featured and nano-featured surface.

DETAILED DESCRIPTION OF THE INVENTION

Figure 1:
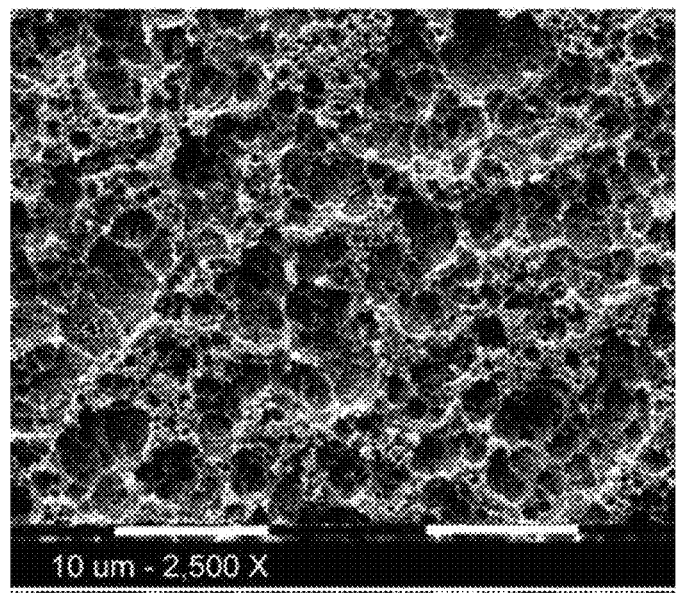
FIG. 1 is a scanning electron micrograph (SEM) of a micro-featured and nano-featured aluminum surface according to Example 1.

The present invention will now be described in detail with reference to embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with the present invention, there is provided a dry adhesive comprising a micro-featured and nano-featured surface (also called hereinafter the "featured surface"), and a compliant surface having a hardness of 60 Shore A or less; the featured surface and the compliant surface forming upon contact a dry adhesive bond with each other.

In an embodiment, the present invention relates to micro-featured and nano-featured surfaces for the dry adhesion of a compliant surface having a hardness of 60 Shore A or less. These featured surfaces are able to form upon contact a dry adhesive bond with the compliant surface. The present invention also relates to methods for producing such featured surfaces. The present invention also relate to the use of a micro-featured and nano-featured surface as a substrate for the dry adhesion a compliant surface In another embodiment, the present invention relates to dry self-adhesive based on the dry adhesive of the invention. In these dry self-adhesives, the featured surface and the compliant surface are each located on one or more different areas of a same physical surface. The dry self-adhesive thus comprises a surface having one or more micro-featured and nano-featured areas (also called hereinafter the "featured areas") and one or more compliant areas, wherein the compliant areas have a hardness of 60 Shore A or less. In the dry self-adhesive, the featured areas are able to form upon contact a dry adhesive bond with the compliant areas.

In yet another embodiment, there is also provided a laminating film based on the dry adhesive of the invention. The laminating film comprises a compliant surface having a hardness of 60 Shore A or less for laminating a micro-featured and nano-featured surface. This compliant surface is capable of forming upon contact a dry adhesive bond with the featured surface to be laminated.

In other embodiments, the present invention relates to various applications of the above.

It is to be noted that herein, phrasings like "micro-featured and nano-featured surface" and "compliant surface" do not necessarily indicate that a whole surface is micro-featured and nano-featured or compliant. Rather, as will be seen below, only one large or several small areas of the surface can be micro-featured and nano-featured or compliant. This is the case notably for the dry self-adhesive, but also the dry-adhesive, the micro-featured and nano-featured surfaces for the dry adhesion and the laminating films. Herein, unless otherwise indicated, "micro-featured and nano-featured surface" (or "featured surface") and "compliant surface" designate surfaces that are completely or only partially micro-featured and nano-featured or compliant, respectively.

It is also to be noted that the micro-featured and nano-featured surface and the compliant surface may be simply supported on a substrate, this would be the case of inkjet photo paper or of an aluminum sheet modified to bear micro-features and nano-features (see below for more details), or they can be a surface of an object, for example the compliant surface may be a surface of an object made of a compliant material.

Herein, "dry adhesion" is an adhesion where no conventional adhesive is used. No glue, epoxy or other tacky material is used. Without being bound by theory, it is believed that the compliant material adheres to the micro-featured and nano-featured surface because of physical (e.g. van der Waals) and/or chemical interactions between the micro-features and the nano-features and the compliant surface, which, being compliant, conforms with the topography of the featured surface to form reversible mechanical interlock. Thus, when the compliant surface is brought into physical contact with the featured surface, an adhesive bond instantaneously forms between them. This bond is reversible and the surfaces may be detached from one another.

In embodiments, the detachment is non-destructive and/or residue-free. This can be the case, for example, when the featured surface is made of a durable material that does not generate any particle and when the tear strength of the compliant surface is sufficiently high so that it does not leave any residue behind. In these embodiments, the attachment and detachment process is fully reversible and non-destructive and can thus be repeated a large number of times.

In other embodiments, the detachment is not completely non-destructive and/or residue-free. This can be the case when the featured surface is an inkjet photo paper bearing one or more fragile coatings. In such cases, it has been observed by the inventors that detachment may cause some of the fragile coating to peel off. With repeated attachments and detachments, the coating becomes damaged and the strength of the adhesion decreases. Therefore, the attachment and detachment process is not fully reversible and is somewhat destructive. The attachment and detachment can nevertheless be repeated, but not a very large number of times. Such embodiments are nevertheless useful in application where being able to attach and detach the surface from one another a large number of times is not desired. This is the case when the compliant surface is used as a laminating film for laminating a featured surface.

Words and images can be written or drawn using for example a marker, or they can be inkjet printed on several embodiments of the micro-featured and nano-featured surface, the compliant surface and the dry self-adhesive surface.

As a general rule, the thicker the compliant surface, the stronger the dry adhesion will be. Also, the lower the Shore A of the compliant material, the stronger the dry adhesion will be.

Compliant Surface

Herein, a "compliant" surface or material is a surface or material with a relatively low modulus so that it is able to deform and conform. In embodiments, the compliant material or surface has a hardness of 60 Shore-A or less, preferably 55, 50, 45, 40, 35, 30, or 25 Shore-A or less. In these or other embodiments, the compliant material or surface has a hardness of 20, 25, 30, 35, 40, 45, 50, or 55 Shore-A or more In embodiments, the compliant surface is made of an organic and/or inorganic material. Non-limiting examples of such materials include polymers, such as thermoplastic polymers, thermoplastic elastomers, and crosslinked elastomers. Suitable polymers include, but are not limited to, natural polyisoprene, synthethic polyisoprene, polybutadiene, polychloroprene, butyl rubber, styrene-butadiene rubber, nitrile rubber, ethylene propylene rubber, epichlorohydrin rubber, polyacrylic rubber, silicone rubber, fluorosilicone rubber, fluoroelastomers, perfluoroelastomers, polyether block amides, chlorosulfonated polyethylene, ethylene-vinyl acetate, silicone elastomer, polyurethane elastomer, aminopropyl terminated siloxane dimethyl polymers, styrene-ethylene/propylene-styrene (SEPS) thermoplastic elastomer, styrene-ethylene/butylene-styrene (SEBS) thermoplastic elastomer, styrene-isoprene-styrene (SIS) thermoplastic elastomer, styrene-butadiene-styrene (SBS) thermoplastic elastomer, and/or styrene-ethylene/butylene-styrene grafted with maleic anhydride thermoplastic elastomer.

Table I shows non-limiting examples of thermoplastic elastomers together with some of their physical properties. The thermoplastic elastomers are listed with their hardness (Shore A), elongation at break (%), and/or tensile strength (psi). Kraton thermoplastic elastomers are available through Kraton Polymers in Houston, Tex. The datasheets of these polymers are available to the skilled person through the website www.kraton.com and are hereby incorporated by reference.

TABLE I

| Name | Hardness (Shore A) | Elongation at break (%) | Tensile strength (psi) |
|---|---|---|---|
| KRATON ® D SIS - Styrenic block copolymers based on styrene and isoprene | | | |
| KRATON ® D1114 P Polymer (Clear, linear triblock copolymer based on styrene and isoprene with a polystyrene content of 19%.) | 42 | 1300 | 4600 |
| KRATON ® D1160 B Polymer (Clear linear triblock copolymer based on styrene and isoprene with bound styrene of 18.5% mass.) | 48 | 1300 | 4640 |

TABLE I-continued

| Name | Hardness (Shore A) | Elongation at break (%) | Tensile strength (psi) |
|---|---|---|---|
| KRATON ® D1161 B Polymer (Clear, linear block copolymer based on styrene and isoprene with a polystyrene content of 15%.) | 30 | 1300 | 4060 |
| KRATON ® D1163 P Polymer (Clear, linear triblock copolymer based on styrene and isoprene, with a polystyrene content of 15%) | 25 | 1400 | 1500 |
| KRATON ® D SBS - Block copolymers composed of blocks of styrene and butadiene | | | |
| KRATON ® D4141 K Polymer (31% styrene) | 50 | 1300 | 2750 |
| KRATON ® D4150 K Polymer (Linear triblock copolymer based on styrene and butadiene with a polystyrene content of 31%.) | 45 | 1400 | 2800 |
| KRATON ® D4158 K Polymer (Oiled, radial copolymer based on styrene and butadiene with a polystyrene content of 31%.) | 41 | 1110 | 1330 |
| KRATON ® G SEBS/SEPS - Styrenic block copolymers with a hydrogenated midblock of styrene-ethylene/butylene-styrene (SEBS) or styrene-ethylene/propylene-styrene (SEPS) | | | |
| KRATON ® G1645 M Polymer (Linear triblock copolymer based on styrene and ethylene/butylene) | 35 | 600 | 1500 |
| KRATON ® G1657 M Polymer (Clear, linear triblock copolymer based on styrene and ethylene/butylene with a polystyrene content of 13%) | 47 | 750 | 3400 |
| KRATON ® G1702 H Polymer (Clear, linear diblock copolymer based on styrene and ethylene/propylene with a polystyrene content of 28%. | 41 | >100 | 300 |
| KRATON ® G4609 H Polymer (White mineral oil extended linear triblock copolymer based on styrene and ethylene/butylene with a polystyrene content of 33%. Nominal oil content of the polymer is 45.5% w (90 parts/100 parts rubber (phr)). | 22 | — | 800 |
| KRATON ® FG - SEBS polymers with 1.0 to 1.7 wt. % maleic anhydride (MA) grafted onto the rubber midblock | | | |
| KRATON ® FG1924 G Polymer (Clear, linear triblock copolymer based on styrene and ethylene/butylene with a polystyrene content of 13%.) | 49 | 750 | 3400 |

Table II shows non-limiting examples of crosslinked elastomers together with some of their physical properties. The crosslinked elastomers are listed with their hardness (Shore A), elongation at break (%), tensile strength (psi), and tear strength (kN/m). The silicone elastomers are available through Dow Corning. The datasheets of these polymers are available to the skilled person through the website www.dowcorning.com and are hereby incorporated by reference.

TABLE II

| Name | Durometer (Shore A) | Elongation (%) | Tensile strength (psi) | Tear strength (kN/m) |
|---|---|---|---|---|
| Dow Corning ® 3631 (Two-part, solvent free, heat-cured liquid silicone rubber.) | 19 | 800 | 725 | 16 |
| Dow Corning ® D94-20P (Two-part, 1:1 ratio, addition cure silicone elastomer) | 21 | 900 | 765 | N/A |
| Dow Corning ® D94-30P (Two-part, 1:1 ratio, addition cure silicone elastomer) | 33 | 800 | 1000 | 16.1 |
| Silastic ® LC-20-2004 (20 Durometer, 2 parts, 1 to 1 mix, translucent, FDA 21 CFR 177.2600 and BfR, XV, molding and injection molding grade Liquid Silicone Rubber) | 20 | 900 | 940 | 24 |
| Silastic ® LC-9426 (Two-part liquid silicone rubber) | 20 | 790 | 609 | 23 |
| Silastic ® 94-595 (40 Durometer, 2-part, 1 to 1 mix, translucent Liquid Silicone Rubber) | 42 | 610 | 1450 | 34 |
| Silastic ® 94-599 (47 Durometer, 2-part, 1 to 1 mix, translucent, molding grade, Liquid Silicone Rubber) | 49 | 590 | 1595 | 32 |
| Silastic ® LC-9434 (two-part liquid silicone rubber) | 33 | 790 | 797 | 32 |
| Silastic ® LC-9436 (two-part liquid silicone rubber) | 29 | 720 | 855 | 28 |
| Silastic ® LC-9451 (two-part liquid silicone rubber) | 50 | 540 | 1102 | 30 |

TABLE II-continued

| Name | Durometer (Shore A) | Elongation (%) | Tensile strength (psi) | Tear strength (kN/m) |
| --- | --- | --- | --- | --- |
| Silastic ® LC-9452 (two-part liquid silicone rubber) | 50 | 560 | 1015 | 34 |
| Silastic ® LC-9454 (two-part liquid silicone rubber) | 50 | 530 | 1044 | 29 |
| DOW CORNING Class VI Elastomers C6-530 (heat cured elastomer raw materials) | 30 | 831 | 1189 | 27.5 |
| DOW CORNING Class VI Elastomers C6-540 (heat cured elastomer raw materials) | 40 | 742 | 1293 | 41.9 |
| Dow Corning ® S40 (Two-part platinum-catalyzed silicone elastomer) | 40 | 864 | 1250 | 31.2 |
| Dow Corning ® S50 (Two-part platinumcatalyzed silicone elastomers) | 48 | 610 | 1275 | 42.5 |
| Dow Corning ® D94-45M (Two-part, 1:1 ratio, addition cure silicone elastomer) | 45 | 600 | 1050 | 45 |

Another example of compliant material is QLE1031, heat curable silicone elastomer available from Quantum Silicones, Virginia, USA. The datasheets of these polymers are available to the skilled person through the website www.quantumsilicones.com and are hereby incorporated by reference.

In embodiments, inorganic materials, such as single-crystal silicon fabricated as flexible nano membranes, are used as the compliant material. Inorganic nano membranes may indeed conform to the micro-features and nano-features of the featured surface to produce an instantaneous, reversible dry adhesion.

The compliant surface can be the surface of an object made of a compliant material. This object may be a film or any three-dimensional object. In other embodiments, the compliant surface is a surface of a compliant layer supported on a substrate, for example a plastic sheet or the like.

In these and other embodiments, the compliant surface is thin enough to be flexible. As such, it can be provided in various forms and shape. In a particular embodiment, the compliant surface is provided in the form of a roll.

In these and other embodiments, the compliant surface is provided with a conventional adhesive backing (which may be protected by a peel-off film until it is used) for adhering the compliant surface to a substrate.

Micro-Featured and Nano-Featured Surface

Herein, a "micro-featured and nano-featured" (or "featured") surface is a surface that bears micro-features and nano-features. It has been observed by the inventors, as shown in Comparative Example 1, that the presence of both micro-features and nano-features produces a strong dry adhesive bond. Such micro-features and nano-features can be seen in FIGS. 1 to 5. In particular, the micro-features and nano-features can be micropores and nanopores of different regular or irregular shapes.

Herein, "nano", as in nano-features and nanopores, refers to features and pore with sizes in the range of about 1 to about 100 nanometers (nm) and "micro", as in micro-features and micropores, refers to features and pores with sizes greater than about 0.1 up to about 5 microns (μm).

The roughness of the micro-featured and nano-featured surface (or areas) can be expressed using $R_a$, the roughness average in amplitude, and $RS_m$, the mean spacing of profile irregularities. As will be seen below, the density, micro-features, nano-features, and surface functionalization of the micro-featured and nano-featured surface can be controlled and tailored as described below.

In embodiments, $R_a$ varies from about 0.2 μm to about 3.0 μm. In more specific embodiments, it varies between about 0.2 μm and about 1.5 μm or preferably between about 0.25 μm and about 1.0 μm or between about 0.2 μm and about 0.7 μm. In these or other embodiments, $RS_m$ may vary from about 20 nm to about 2,000 nm. In more specific embodiments, it varies between about 20 nm and about 1500 nm, or between about 20 nm and about 1,000 nm or between about 20 nm and about 500 nm.

In embodiments, the featured surface is a metallic surface, a glass surface, a paper surface or a polymeric surface. Non-limiting examples of metallic surfaces include aluminum, copper, and stainless steel surfaces modified to bear micro-features and nano-features. Non-limiting examples of polymeric surfaces include polyethylene terephthalate, polyolefin, polyamine, polysiloxane, polyimide and polyurethane surfaces, each of which optionally comprising inorganic or organic particles. In these and other embodiments, the particles are used to impart micro-features and/or nano-features to the surface. In embodiments, the organic and inorganic particles are nanoparticles and/or microparticles comprising nanopores. In embodiments, nanoporous and/or nanoparticulate materials such as calcium carbonate, zeolites, fumed silica, zirconium oxide, titanium oxide, activated carbons, polyhedral oligomeric silsesquioxanes (POSS), carbon nanotubes, graphene, alumina (such as Cab-O-Sperse PG008) and/or activated alumina are used.

In embodiments, the featured surface is paper-based. Not all types of paper have a micro-featured and nano-featured surface. However, many commercially available papers do have such a surface. This is the case notably of many papers for printing with inkjet printers, especially for printing photos with such printers (hereinafter "inkjet photo paper". In embodiments, the featured surface is a surface of a microporous inkjet paper or a resin coated inkjet paper. There is a plurality of such inkjet papers available under different brands. These papers have micro-features and nano-features that allow faster drying of aqueous ink and better overall quality of the printed photo. Depending on their method of manufacture, these papers will bear one or more coatings with or without organic and inorganic particles. These coatings and/or particles provide the micro-features and nano-features. In embodiments, these inkjet papers comprise fumed silica and/or fumed alumina, which may be held together by polyvinyl alcohol. Such inkjet papers are widely available from Epson™, Canon™, HP™, Kodar™, and/or Ilford™. These photo papers may be available in various finishes such as glossy, matte, silky, and lustre. Non-limiting examples of suitable inkjet photo paper include:
Epson™ Ultra Premium Photo Paper Glossy,
Epson™ Premium Resin Coated Glossy Photo Paper,
Canon™ Matte Photo Paper,
Canon™ Photo Paper Plus II Glossy,
HP™ Advanced Photo Paper Glossy,
Kodak™ Photo Paper Glossy,
Kodak™ Photo Paper Matte,
Ilford™ Galerie Smooth Pearl Paper, and
Ilford™ Galerie Smooth Gloss Paper.

In embodiment, the surface is an aluminum surface. Such surface can be produced with a thickness down to 6 µm, which makes them flexible.

In embodiment, the surface is a polyethylene phthalate surface comprising one or more nanoporous and/or nanoparticulate materials.

In several embodiments, the micro-featured and nano-featured surface is thin enough to be flexible. As such, it can be provided in various forms and shape. In a particular embodiment, the featured surface is provided in the form of a roll.

In a more specific embodiment, the micro-featured and nano-featured surface is adhered to the compliant surface and both surfaces are then rolled. Thus, the dry adhesive itself is provided as a roll.

In these and other embodiments, the featured surface and/or the compliant surface can be provided with a conventional adhesive backing (which may be protected by peel-off films until they are used) for adhering them to substrates. This allows adhering the compliant surface to a first substrate and the micro-featured and nano-featured surface to a second substrate and reversibly adhering the first substrate to the second substrate via the dry adhesive featured surface/compliant surface interaction.

The micro-featured and nano-featured surface allows the instantaneous dry adhesion of the compliant surface. This is unexpected because the featured surface and the compliant surface, have no adhesive property of their own; i.e. they are non-tacky.

Method for Producing a Micro-Featured and Nano-Featured Surface

As stated above, the micro-featured and nano-featured surface can be a commercially available product such as inkjet photo paper. This surface can also be produced by modifying a surface of a material to create micro-features and nano-features thereon.

Figure 6:
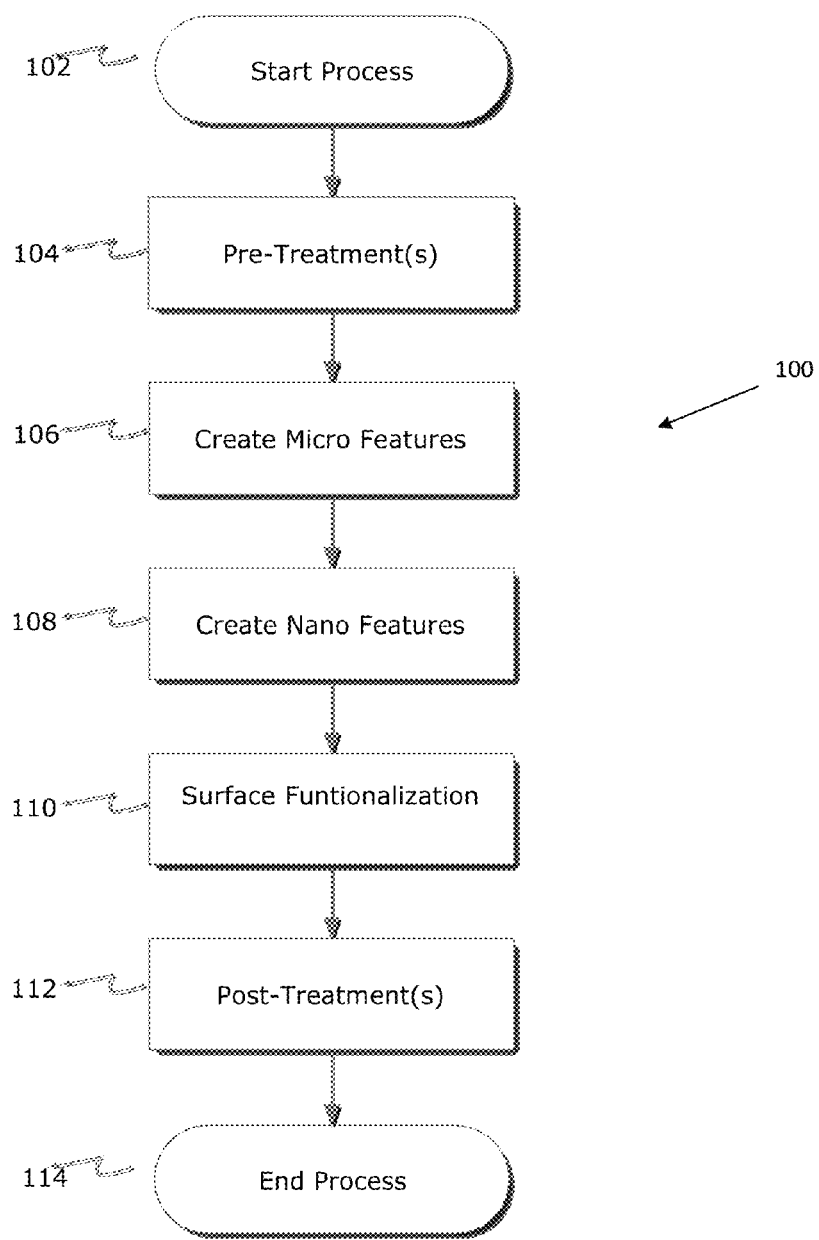
FIG. 6 is a flowchart of a process for creating micro-features and nano-features on a surface in accordance with one or more embodiments of the present invention.

Thus, turning now to a method of making micro-featured and nano-featured surfaces, FIG. 6 shows a flowchart of a process for creating micro-features and nano-features on a surface in accordance with an embodiment of the invention. This flow chart illustrates a top level process 100 for creating surfaces of e.g. metal, plastic and/or glass with micro-features and nano-features. In this process, steps 102, 104, 110, 112, and 114 are optional.

As shown in FIG. 6, process 100 may starts with optional step 102, in which an operator selects, if needed, the material to be processed.

In optional step 104, the selected material is treated to prepare the surface of the selected material as needed.

Consider the situation where for example, the selected material is metal or glass. The selected material may be pre-treated to clean it so as to remove accumulated surface contaminants such as particulates and/or oils and greases. This cleaning may comprise of a single rinse with deionized water or a plurality of sub-steps. For example, it may comprise, but is not limited to, one or more of rinsing with deionized water, degreasing with a neutral, acidic and/or alkaline detergent solution, rinsing with deionized water, and drying. A person of ordinary skills in the art would appreciate that pre-treatment step 104 may be modified to achieve the desired level of cleanliness depending on the selected material and the level and nature of the contamination on the surface of the selected material.

Consider another situation wherein for example, the selected material is a raw polymer in pellets form. In such a case, the raw polymer may be compounded, in pre-treatment step 104, with other additives in effective concentration to attain desired end user properties. To simplify discussion, these additives are not discussed in details since additives such as plasticizers, fillers, colorants, processing aids, antioxidants, and flame retardants are well known to persons of ordinary skills in the art, who will appreciate that they may be selected depending on end use application.

In an embodiment, nanoporous and/or nanoparticulate materials, such as calcium carbonate, zeolites, fumed silica, zirconium oxide, titanium oxide, activated carbons, polyhedral oligomeric silsesquioxanes (POSS), carbon nanotubes, graphene, and/or activated alumina, are employed as additives in pre-treatment step 104. The nano additives are compounded with the aforementioned raw polymer to form a composition for subsequent processing steps.

As shown in FIG. 6, step 106 entails the creation micro-features on the surface of the selected material. Non-limiting examples of treatments allowing the creation of micro-features on the surface include mechanical graining, chemical graining, electrolytic graining, plasma graining and combination thereof.

In embodiments, mechanical graining is performed on the surface of the selected material by mechanical abrasion, such as scrubbing and/or sandblasting. Graining with sand and/or pumice can be performed using wire brushes or marbles on the surface of the selected material. The resulting grained surface may be relatively rough. In other embodiments, the surface of the selected material is roughened by blasting, under high pressure, a stream of abrasive materials.

In embodiments, chemical graining is performed on the surface of the selected material through chemical etching or milling by exposing the surface of the selected material to a caustic solution (such as a sodium hydroxide solution) and/or an acidic solution (such as a hydrochloric acid solution). For example, glass may be chemically grained by exposing the glass surface to a sodium fluoride cream.

In an embodiment, electrolytic graining is performed on the surface of the selected material, for example a metal such as aluminum, by exposing the surface of the selected material to the action of an electrical current in an aqueous electrolytic solution. The grained surface resulting from electrolytic graining may be very fine and uniform.

In another embodiment, plasma graining may be performed by exposing the surface of the selected material to low temperature, radio frequency (RF) plasma in vacuum. For example, the plasma chamber may be evacuated to about $10^{-3}$ to about $10^{-6}$ torr and the RF plasma is powered in the range from about 500 kiloHertz to about 10 megaHertz.

Alternatively, other method(s) may be employed to create micro-features on the surface of the selected material. Consider the situation wherein for example, the selected material is a ductile material such as polypropylene. In such cases, nano additives may be selectively added in pre-treatment step 104 for compounding. In accordance with an embodiment of the invention, the polypropylene film may then be uniaxially or biaxially stretched to induce cavitation around the nano additives and thus create micropores.

As may be appreciated from the foregoing, a plurality of methods may be employed to selectively create micro-features on the surface of the selected material. A person of ordinary skills in the art will appreciate that micro-feature creation step 106 may be modified to achieve the desired microtopography.

Step 108 of FIG. 6 entails creating nano-features on the surface of the selected substrate of step 102. In a non-limiting example, nano-features on a surface of the selected material are created by electrolytic anodization and/or by incorporating nano porous and/or nano particulate materials in the material.

In an embodiment, electrolytic anodization may be performed on the surface of the selected material, such as a metal. Consider the situation where the selected material is aluminum. Anodization is an electrochemical process wherein the surface of the selected material, aluminum, is exposed to the action of an electrical current in an aqueous acidic electrolytic solution, such as, for example, diluted sulfuric acid. The surface resulting from sulfuric acid anodization will have a porous aluminum oxide layer. The idealized porous aluminum oxide layer may be represented by a cellular structure with a central pore in each cell. The aluminum oxide film thickness, the cell size and the pore size will depend on the process conditions such as the composition of the aqueous acidic electrolytic solution, the temperature, and/or the current density. The aluminum oxide layer from electrolytic anodization may produce surfaces with high densities of nanopores. The cells may have diameter in the range of about 50 to about 300 nm. The pores may have diameter in the range of about 15 to about 150 nm. The cell density may range from about 10 to 100 cells per $\mu m^2$.

Consider the situation where the selected material is glass. This glass may be, for example, the extraction product of phase separated sodium boron silicate glass. In an embodiment, phase separated sodium boron silicate glass may be made porous with pore sizes in the range of about 1 to about 500 nm.

Alternatively other method(s) may be employed to create nano-features on the surface of the selected material. Consider the situation where for example, the selected material is a polymeric material such as a polyethylene, polypropylene, polyamide, polyimide or polyethylene terephthalate film. In an embodiment, nano and micro particulate additives may be selectively added in pre-treatment step 104 for compounding. In accordance with an embodiment of the invention, the particulate additive may be fumed silica oxide. Fumed silica oxide typically may have particle size ranging from about 5 to about 2,000 nm with a surface ranging from about 50 to about 600 $m^2/g$.

As may be appreciated from the foregoing, a plurality of methods can be employed to selectively create nano-features on the surface of the selected material. A person of ordinary skills in the art would appreciate that nano-feature creation step 108 may be modified to achieve the desired nanotopography.

Step 110 of FIG. 6 is optional and entails the creation of functional group(s) on the surface of the selected substrate. In a non-limiting example, functionalization on a surface of the selected material may be created by employing different functional chemical agents. Non-limiting examples of such functional groups include phosphate fluoride (obtained for example by treating aluminum after anodization with a solution of $NaH_2PO_4$ and NaF). Other treatments include treatment with polyvinyl phosphoric acid and/or vinyl phosphoric acid-methacrylic acid as well as treatments with aqueous solutions containing sodium silicate.

Post treatment step 112 of FIG. 6 may optionally be carried out in process 100 to perform various treatments. In a non-limiting example, the surface of the selected material may be cleaned, rinsed, neutralized, colored, sealed, and/or cut to achieve end user requirements.

As shown in FIG. 6, process 100 is terminated at step 114. The treated surface of the selected material is ready for use.

Figure 7:
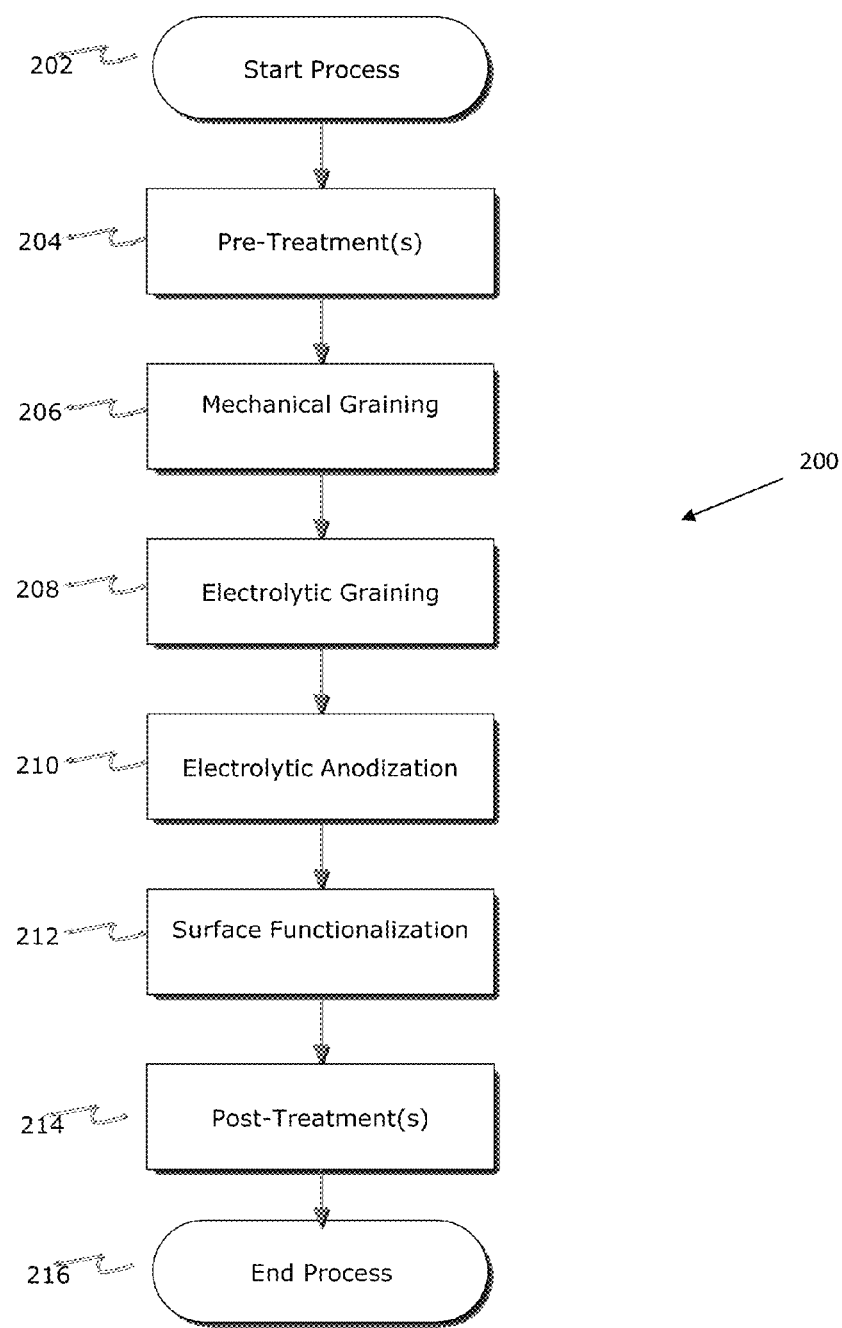
FIG. 7 is a flowchart of a process for creating micro-features and nano-features on an aluminum surface in accordance with one or more embodiments of the present invention.

Aluminum is an advantageous raw material due some of its characteristics including lightness, specific strength, machinability, and surface treatability. FIG. 7 shows a flowchart of process 200 for creating micro-features and nano-features on an aluminum surface in accordance with one or more embodiments of the present invention. To facilitate understanding, FIG. 7 will be discussed in relation to FIG. 6 to illustrate how the steps in FIG. 7 may be applied to the aluminum surface. In this figure, steps 202, 204, 212, 214 and 216 are optional. Additionally, either or both of steps 206 and 208 can be carried out in process 200.

In accordance with an embodiment of this invention, surface treatment process 200 for aluminum may be performed on a continuous production line with a speed of, for example, about 10 meters per minute. In accordance with another embodiment of the invention, the surface treatment process 200 is a batch process.

As shown in FIG. 7, process 200 starts with optional step 202, in which an operator selects aluminum for processing.

In accordance with one or more embodiments, the aluminum surface of step 202 may be pre-treated in optional step 204 of FIG. 7.

In pre-treatment step 204, the aluminum surface may be, for example, cleaned. Step 204 of FIG. 7 corresponds to pre-treatment step 104 of FIG. 6. In an embodiment, the aluminum surface may be cleaned by degreasing. Degreasing may include washing the aluminum surface with an alkaline solution containing an effective concentration of caustic solution to remove oils and greases. In a non-limiting example, the effective concentration of the caustic solution may be about 3.85 g/L of sodium hydroxide (NaOH) and/or about 0.95 g/L of sodium gluconate. A non-limiting example of the process conditions for degreasing is washing the aluminum surface in the caustic solution at about 70° C. for about 3 minutes. In an embodiment, degreasing may further include neutralizing the degreased aluminum surface with an effective acidic solution. In a non-limiting example, the effective concentration of the acidic solution may be about 0.5 g/L of hydrochloric acid (HCl). The neutralized aluminum surface may further be rinsed with de-ionized water. A person of ordinary skills in the art would appreciate that step 204 may be modified to achieve the desired level of cleanliness depending on the selected material and the contaminants on the aluminum surface.

In accordance with an embodiment, one or both of mechanical graining step 206 and electrolytic graining step 208 are employed in process 200 to create micro-features on the surface of the aluminum. Both of step 206 and step 208 of FIG. 7 correspond to step 106 of FIG. 6.

In an embodiment, micro-features may be created on the aluminum surface by mechanical graining step 206. In a non-limiting example, mechanical graining step 206 may be performed by employing nylon brush rollers on the aluminum surface in an aqueous suspension containing about 400 mesh pumice stone powder. The mechanically grained aluminum surface may then be washed with de-ionized water.

Additionally or alternatively, micro-features may be created on the aluminum surface by electrolytic graining step 208. In a non-limiting example, electrolytic graining step 208 may be performed by employing carbon electrodes and different effective acidic electrolyte solutions at about 25° C. with different effective alternating current density. In non-limiting examples, effective acidic electrolyte solutions may comprise at least one of about 6.0 g/L hydrochloric acid solution, about 8.0 g/L hydrochloric acid and about 16.0 g/L acetic acid ($CH_3COOH$) solution, and/or about 10 g/L nitric acid ($HNO_3$) solution. In an example, the effective alternating current density may range from about 160 to about 1250 $C/dm^2$.

In an embodiment, electrolytic graining step 208 further includes neutralizing the electrolytically grained surface with an effective aqueous alkaline solution. In a non-limiting example, the effective concentration of the aqueous alkaline solution may be about 3.0 g/L of sodium hydroxide. The neutralized aluminum surface may then be rinsed with de-ionized water. A person of ordinary skills in the art would appreciate that the conditions used in the mechanical graining step 206 and electrolytic graining step 208 may be modified to achieve the desired level of micro-features depending on the end user application requirements. Also, the order of these graining operations can be reversed.

As shown in FIG. 7, the next step is electrolytic anodization step 210, which entails the creation of nano-features on the surface of the aluminum. Step 210 of FIG. 7 corresponds to step 108 of FIG. 6. Nano-features are created on the aluminum surface by electrolytic anodization, which form an aluminum oxide layer having a nano porous structure and harden the surface of the grained aluminum. In a non-limiting example, electrolytic anodization step 210 may be performed using 316 stainless steel electrodes and different effective acidic electrolyte solutions at about 20° C. with different effective direct current density. In embodiments, the effective acidic electrolyte solutions may be at least one of about 140.0 g/L sulfuric acid ($H_2SO_4$) solution and/or about 160 g/L phosphoric acid ($H_3PO_4$) solution. In an example, the effective direct current density ranges from about 5.6 to 7 $A/dm^2$. In an embodiment, electrolytic anodization step 210 of FIG. 7 may further include rinsing the electrolytically anodized aluminum surface with de-ionized water. A person of ordinary skills in the art would appreciate that the conditions used for the electrolytic anodization may be modified to achieve the desired nanotopography.

As shown in FIG. 7 in accordance with an embodiment, surface functionalization step 212 may be optionally carried out to create functional groups on the surface of the aluminum. Step 212 of FIG. 7 corresponds to surface functionalization creation step 110 of FIG. 6.

In an embodiment, the functionalization of the aluminum surface in surface functionalization step 212 is carried out to enhance intermolecular interactions and improve adhesion to the surface. In a non-limiting example, surface functionalization may be performed by immersing the aluminum surface into an effective aqueous solution containing a plurality of surface functionalized chemical agents at about 60° C. In non-limiting examples, effective aqueous solutions containing functionalized chemical agents may comprise at least one of about 50.0 g/L monosodium phosphate ($NaH_2PO_4$) and/or about 0.80 g/L sodium fluoride (NaF) solution and/or about 0.30 g/L vinyl phosphoric and acrylic copolymer solution. In an embodiment, surface functionalization step 212 may further include rinsing the functionalized aluminum surface with de-ionized water and/or drying the functionalized aluminum surface at about 120° C. with hot air. A person of ordinary skills in the art would appreciate that the optional surface functionalization step 212 may be modified to achieve the desired surface functionalities.

Optional post treatment step 214 of FIG. 7 comprises various treatments of the aluminum substrate. In embodiments, the surface may be cleaned, rinsed, neutralized, colored, sealed, and/or cut to achieve end user requirements.

In a specific embodiment, the surface of the treated aluminum may be colored by immersing it in a dye solution before sealing it to create a colored surface. For example, the treated surface may be colored red with a about 2.0 g/L to about 10 g/L dye solution with pH of about 4 to about 6 for about 1 to about 30 minutes at temperature between about 140 and about 160° F. The dye may be e.g. a metal-free azo dye such as OrcoAluminum™ Red CW.

A person of ordinary skills in the art would appreciate that the post treatment step 214 may be modified to achieve desired surface characteristics.

As shown in FIG. 7, process 200 may be terminated at step 216. The treated aluminum surface is ready for use.

A person of ordinary skills in the art would appreciate that the process 200 of FIG. 7, in particular, and the process 100 of FIG. 6, in general, may be modified to achieve the desired surface characteristics of a plurality of materials.

As can be appreciated from the foregoing, selected materials are treated to create micro-features and nano-features and optional surface functionalities, which result in micro-featured and nano-featured surfaces that act as dry adhesive for non-tacky, dry compliant surfaces. Advantageously, the above treatment processes may be employed on popular raw material, such as aluminum, to allow unexpected adhesion to commonly available elastomer, in contrast with current attempts to create dry adhesives. Thus, the adhesion of the treated surface (made of commonly available raw materials) to widely available compliant materials enables mass implementation of the invention.

Dry Self-Adhesive

In a particular embodiment of the above dry adhesive, the featured surface and the compliant surface having a hardness of 60 Shore A or less are each located on one or more different areas of a same physical surface. It this case, the micro-featured and nano-featured area(s) is(are) capable of forming upon contact a dry adhesive bond with the compliant area(s) and the dry adhesive is thus self-adhesive.

Therefore, the present invention also provides a dry self-adhesive. This dry self-adhesive comprises a surface bearing one or more micro-featured and nano-featured areas and one or more compliant areas, which will be referred hereinafter as a dry self-adhesive surface. This dry self-adhesive surface can adhere to itself or other surfaces like itself simply by bringing the compliant area(s) into physical contact with the featured area(s). The surface bearing these areas is thus a dry self-adhesive in the sense it that it can adhere to itself and/or to other self-adhesive surfaces like itself through a dry adhesive bond (without using any conventional adhesive).

Depending on the intended use of the dry self-adhesive, the featured areas and the compliant areas can be as small as 1 μm or as large as several centimeters. Therefore, in embodiments, the featured areas and/or the compliant areas are, for example, several hundreds μm or a few mm in size. For a narrow strip of tape, the areas may be quite small and have, for example, a diameter as small as 1 micrometer. Alternatively, for a large construction block toy, e.g. a Lego™ block, the areas may have a diameter of several centimeters.

The dry self-adhesive can adhere to itself when it is bent so that the compliant area(s) are brought into physical contact with the micro-featured and nano-featured area(s). In embodiments where the dry self-adhesive cannot be bent, it is cut so that at least part of the micro-featured and nano-featured area(s) and part of the compliant area(s) are separated from each other. The cut parts are then placed face-to-face so that the compliant area(s) are brought into physical contact with the micro-featured and nano-featured area(s).

In several embodiments, the dry self-adhesive is thin enough to be flexible. As such, it can be provided in various forms and shape. In a particular embodiment, the dry self-adhesive surface is provided in the form of a roll.

In these and other embodiments, the dry self-adhesive is provided with a conventional adhesive backing (which may be protected by a peel-off film until it is used) for adhering the dry self-adhesive to one or more substrates. This allows reversibly adhering these various substrates to each other via the interaction of the dry self-adhesive with itself.

Figure 8:
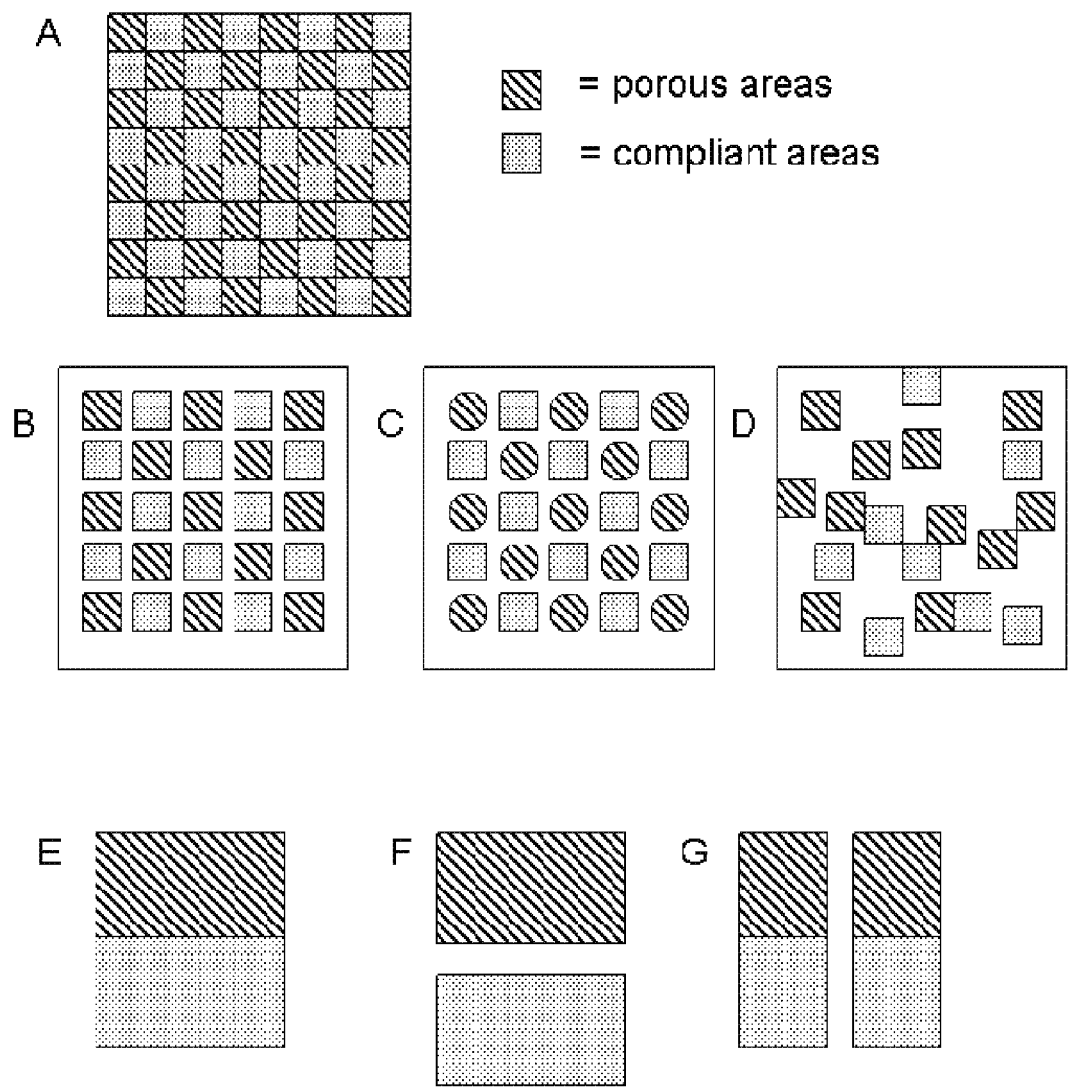
FIG. 8 (A to G) shows dry self-adhesives according to various embodiments of the invention.

FIG. 8 (A to F) shows dry self-adhesives according to various embodiment of the invention. In one embodiment shown in FIG. 8A, the surface comprises several micro-featured and nano-featured areas (hatched squares) and several compliant areas (dotted squares). In another embodiment shown in FIG. 8B, the micro-featured and nano-featured areas and the compliant areas are separated from each other rather than being contiguous. In FIG. 8C, the shape of the micro-featured and nano-featured areas is different from that of the compliant areas. It should be noted that the micro-featured and nano-featured areas and the compliant areas can be of regular or irregular shape. In FIG. 8D, the micro-featured and nano-featured areas and the compliant areas are irregularly arranged. It will be clear to the skilled person that the micro-featured and nano-featured areas and compliant areas can be randomly or regularly distributed throughout the surface. Also, the number of micro-featured and nano-featured areas is different from the number of compliant areas. In FIG. 8E, the dry self-adhesive surface comprises only one micro-featured and nano-featured area (hatched rectangle) and one compliant area (dotted rectangle). This dry adhesive surface can be, for example, cut as shown in FIGS. 8F and 8G so that at least part of the micro-featured and nano-featured area and part of the compliant area are separated from each other.

Figure 9:
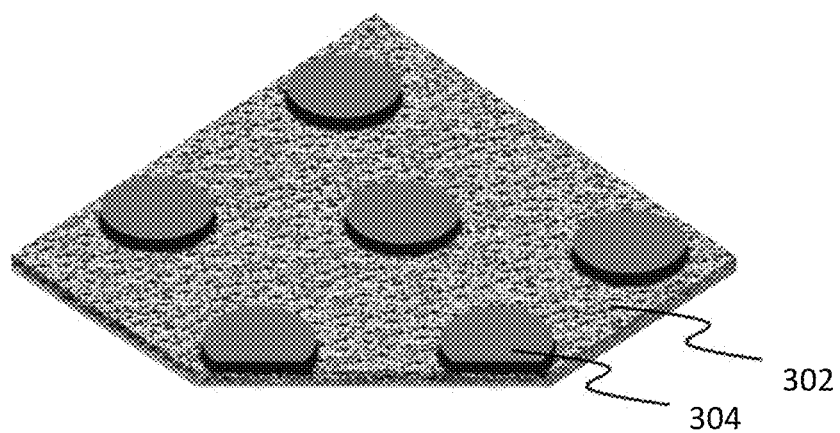
FIG. 9 is a dry self-adhesive according to an embodiment of the invention.

FIG. 9 shows an embodiment of the dry self-adhesive. In this figure, compliant areas 304 are spread on a micro-featured and nano-featured surface 302 (for example, the modified surface of an aluminum sheet). Note that it is also possible to have micro-featured and nano-featured areas 304 spread on a compliance surface 302.

Figure 10:
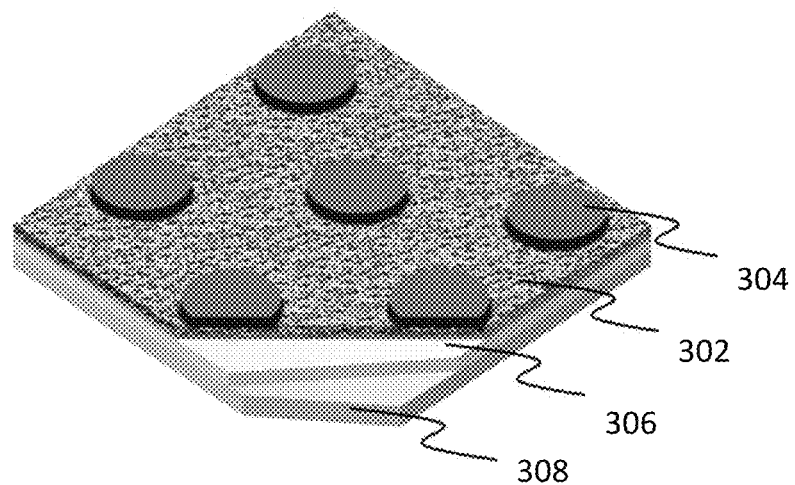
FIG. 10 is a dry self-adhesive according to another embodiment of the invention.

FIG. 10 shows another embodiment of the dry self-adhesive. In this Figure, compliant areas 304 are spread on micro-featured and nano-featured surface 302 of a paper sheet 306 backed by a plastic layer 308.

Figure 11:
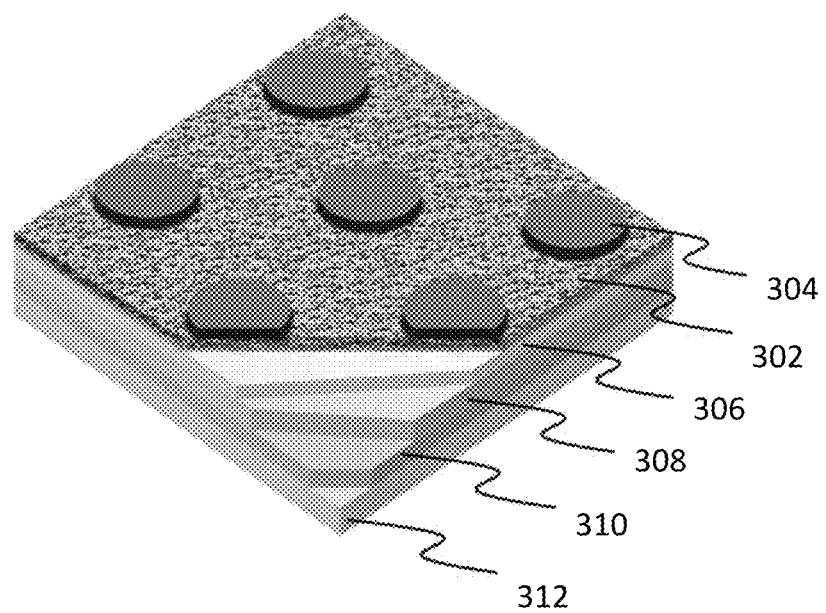
FIG. 11 is a dry self-adhesive according to yet another embodiment of the invention.

FIG. 11 shows another embodiment of the dry self-adhesive. This embodiment is similar to the embodiment shown in FIG. 10, except that a regular (tacky) adhesive layer 310 covers the plastic layer 308 and that a peel-off layer 312 covers the adhesive layer 310. In use, this particular embodiment of the invention can be permanently adhered to a surface by peeling off the peal-off layer 312 and putting the adhesive layer 310 in contact with the surface. The compliant areas 304 and the micro-featured and nano-featured surface 302 then allow adhesion of other surfaces with compliant area(s) and/or micro-featured and nano-featured area(s).

Figure 12:
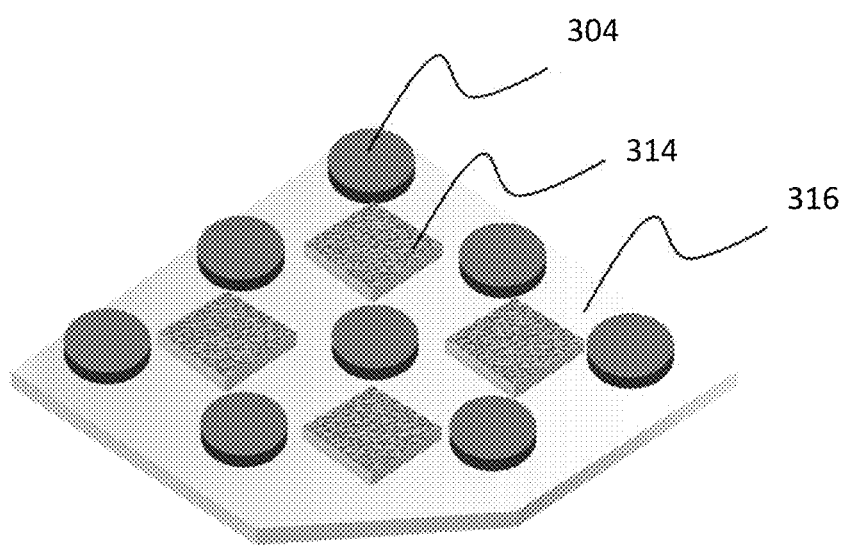
FIG. 12 is a dry self-adhesive according to another embodiment of the invention.

FIG. 12 shows another embodiment of the dry self-adhesive. In this embodiment, a surface 316 bears compliant areas 304 and micro-featured and nano-featured areas 314. The surface 316 may be for example a plastic or paper sheet.

In embodiments in which the featured areas and the compliant areas are alternating, such as for example when they are arranged in a check-board pattern, and in which one type of area is raised compared to the other type of area (see for example FIG. 9), the size of the raised areas is preferably somewhat smaller than the spacing in between them so as to allow the raised areas to better fit into the spacing. This allows better physical contact between both type or areas and thus the desired dry adhesion. A way of describing these dry self adhesives is to define an "area ratio", which is the ratio of the total area occupied by the raised areas to the total area occupied by the areas of the other type. In embodiments, this area ratio is 1:1.1 or more.

As is apparent from the above, the dry self-adhesive can be produced by printing or coating a compliant material onto a micro-featured and nano-featured substrate so as to form compliant area(s) or by printing or coating a micro-featured and nano-featured material onto a compliant substrate so as to form micro-featured and nano-featured area(s). In another embodiment, both micro-featured and nano-featured area(s) and compliant area(s) can be printed on coated on a substrate, such as for example, a plastic, paper or metal sheet.

Laminating Films

The present invention also relates of laminating films featuring the dry adhesive. More specifically, the present invention relates to laminating films having a compliant surface having a hardness of 60 Shore A or less for laminating a micro-featured and nano-featured surface.

The non-tacky compliant surface of the laminating film is capable of forming upon contact a dry adhesive bond with the non-tacky micro-featured and nano-featured surface to be laminated. Therefore, when the compliant surface is brought into physical contact with the featured surface, a dry adhesive bond instantaneously forms. As this process takes place at room temperature, the featured surface may be laminated at room temperature, which is advantageous compared to some other laminating films. Further, the laminating film may advantageously be applied without pressure; a simple swipe with one hand being sufficient to effect the lamination. Consequently, the use of laminating equipment is not necessary. Further, in contrast to the hot melt lamination films of the prior art, the thickness of laminating film of the invention is not limited by heat transfer constraints. Finally, all of this facilitates the use of cheaper raw materials for the various layers of the laminating film as discussed below.

As explained with regard to the dry adhesive above, the dry adhesion is, in many embodiments, reversible. In such case, the laminating film with the compliant surface can be detached from the micro-featured and nano-featured surface in a non-destructive manner. The detachment process will be residue-free when the tear strengths of the compliant surface and micro-featured and nano-featured surface are both sufficiently high. Thus, if desired, a laminating film removed from a micro-featured and nano-featured surface may be re-applied to the same or another micro-featured and nano-featured surface. In embodiments, the adhesion is completely reversible, meaning that the laminating film can be repeatedly laminated on and delaminated from one or more micro-featured and nano-featured surface. In embodiments, the adhesion is partially reversible, meaning that the laminating film can be laminated on and delaminated from one or more micro-featured and nano-featured surface only a certain number of times or that a micro-featured and nano-featured surface can be laminated and delaminated by one of more laminating film only a certain number of times. An advantage of this reversibility (even the limited reversibility) is that the laminating film may be applied, removed, adjusted, and/or reused.

The micro-featured and nano-featured surface to be laminated is of the same nature as the above-described micro-featured and nano-featured surface. To simplify discussion, the description of this material is not repeated here. In embodiments however, the micro-featured and nano-featured surface is advantageously paper-based, such as the above-described inkjet photo paper. It is an advantage of the present laminating film that it can be used on popular commercially available inkjet papers.

In many embodiments, the featured surface bears information or an image that is to be preserved by lamination.

The compliant surface of the laminating film is of the same nature as the compliant surface described above. To simplify discussion, the description of this material is not repeated here. In an embodiment, the compliant surface is made of an elastomer and/or elastomeric composition having hardness less than 60 Shore A such as those of Table I and II above.

In embodiments, the laminating film comprises of a plurality of layers. A person of ordinary skills in the art will be able to select the number of layers in the film in accordance with its desired functionality. In an embodiment, the laminating film comprises a base film on which a compliant layer is located. In embodiments, the compliant layer is coated or extruded on the base film.

In embodiments, the base film may comprise or be made of, for example, of PET, PP, PE (polyethylene) or any transparent plastic film. In embodiments, the base film may comprise or be made of a polymer mainly comprising, but not being limited to, polypropylene (PP), polyethylene terephthalate (PET), polybutylene terephthalate, polyethylene terephthalate-isophthalate copolymers, polyamide, polyimides, triacetylcellulose, acrylic resins, polyether sulfones, polyvinyl chlorides, vinyl chloride-vinylidene chloride copolymers, polystyrene, and/or polystyrene copolymer. A person of ordinary skills in the art will appreciate that these and other polymers may be employed for the base film either alone or as a blend. For example, transparent polymer(s) may be used if the surface to be laminated has visual information that may need to be displayed such as a printed image. Alternatively, translucent and/or non-transparent polymer(s) may be selected if the visual information on the substrate to be protected does not need to be displayed.

The base film may further comprise an UV absorber. In an embodiment, this UV absorber is incorporated in the base film during its extrusion. This UV absorber will retard fading of the printed images due to UV rays. Non limiting examples of UV absorber include benzophenone, oxanilide, benzotriazole, hydroxyphenyltriazine and mixtures thereof.

Non-limiting examples of benzophenone include 2,4-dihydroxybenzophenone, 2-hydroxy-4-methoxybenzophenone, 2-hydroxy-4-n-(octyloxy)bezophenone, 2,2',4,4'-tetrahydroxybenzophenone, 2-hydroxy-4-methoxy-5-sulfobenzophenone and mixtures thereof.

Non-limiting examples of oxanilide include 2,2',4,4' tetra nitro oxanilide and/or N,N'-diphenyloxamide and mixtures thereof.

Non-limiting examples of benzotriazole and hydroxyphenyltriazines include 2-(2-hydroxy-5-methylphenyl)benzotriazole, 2-(2H-benzotriazol-2-yl)-4-(1,1',3,3'-tetramethylbutyl)phenone, 2-tert-butyl-6-(5-chloro-2H-benzotriazol-2-yl)-4-methylphenone, 2-(2H-benzotriazol-2-yl)-4,6-di-tert-pentylphenol, 2-(3,5-di-tert-butyl-2-hydroxyphenyl)-5-chloro-2H-benzotriazole, 2-[2H-benzotriazol-2-yl]-4,6-bis (1-methyl-1-phenylethyl)-phenol, 2-[3,5-di-tert-butyl-2-hydroxyphenyl]-2H-benzotriazole, 2,2'-methylenbis[6-(2H-benzotriazol-2-yl)-4-(1,1',3,3'-tetramethylbutyl)phenol], 2-(3-sec-butyl-5' tert-2-hydroxyphenyl)-2H-benzotriazole and mixtures thereof.

In an embodiment, the base film comprises one or more additives. These may, for example, improve the lightfastness of an image printed on the surface to be laminated. For example, hindered amines light stabilizer (HALS) may be employed to scavenge free radicals generated during the thermal oxidation process. In another example, antioxidants may be employed to terminate the oxidation reactions that may take place during the thermal oxidation process.

As may be appreciated from the foregoing, light stabilizers may be employed directly and/or in combinations to prevent and/or minimize the effects of photo oxidation. A person of ordinary skills in the art will be able to select any light stabilizer or combination thereof depending upon the polymer selected for base layer and/or printed image on the surface to be laminated.

In an embodiment, there is an adhesion promoting layer between the base film and the compliant layer to promote the adhesion between these two elements. This adhesion promoting layer may also provide reactive sites allowing the base film to form cohesive bonds with the compliant layer. In an embodiment, the adhesion promoting layer comprises an UV absorber such as those described above.

In embodiments, the adhesion promoting layer comprises a polyethylene resin modified with anhydride functional groups. In a non-limiting example, Admer QF551 E available from Mitsui Chemicals, Tokyo, Japan may be employed as this polyethylene resin. Other adhesion promoting resins are commercially available including for example Bynel® from E.I. du Pont, Plexar® from Equistar, and Amplify™ from the Dow Chemical Company.

In embodiments, the adhesion promoting layer comprises an acid-modified polypropylene resin. Non-limiting examples of the acid component of this resin are carboxylic acid and/or anhydrides of unsaturated carboxylic acids. In embodiments of the acid-modified propylene polymer, the range of acid component may be from about 0.05 weight percent to about 0.45 weight percent. In an embodiment, the acid-modified propylene resin may be a propylene-α-olefin copolymer. In embodiments, the acid-modified propylene resin may further comprise an ethylene-vinyl acetate copolymer and/or its acid-modified derivatives or an ethylene-(meth) acrylic ester copolymer and/or its acid-modified derivatives.

In further embodiments, the compliant surface can be covered by a protective film, which protects the laminating film until it is used. In embodiments, the protective film is an (advantageously inexpensive) polymeric material, such as polyethylene, polypropylene, polyvinylchloride, ethylene vinyl acetate, and/or amorphous polyethylene terephthalate.

Figure 13:
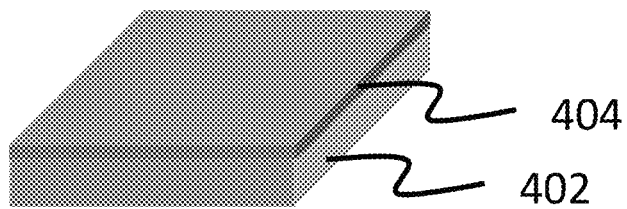
FIG. 13 shows a bi-layer laminating film according to an embodiment of the invention.

FIG. 13 shows a laminating film in accordance with an embodiment of the invention. In this figure, the laminating film comprises base film 402 and a compliant layer 404.

Figure 14:
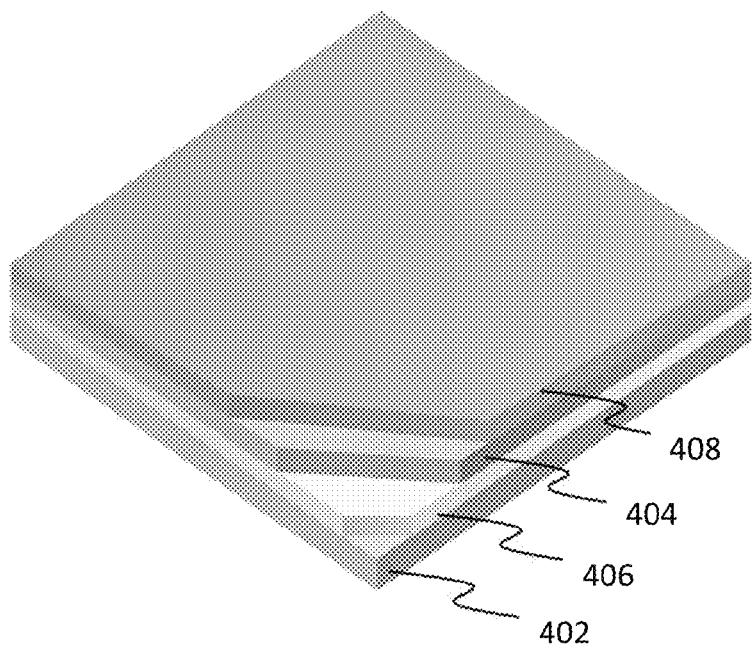
FIG. 14 shows a four-layer laminating film according to an embodiment of the invention

FIG. 14 shows a four-layer laminating film in accordance an embodiment of the invention. The laminating film again comprises base film 402 and a compliant layer 404. There is an adhesion promoting layer 406 between the base film 402 and the compliant layer 404. Further, the compliant layer 404 is covered by a protective film 408.

Any known art may be employed in the fabrication of the laminating film. Non-limiting examples of methods for manufacturing the laminating film is to prepare layers of uniform thickness by co-extrusion or co-stretching. Coating methods can also be used for certain layers.

Boards, Everyday and Industrial Adhesives, Games and Toys and Various Other Applications As the skilled person will appreciate, there is a myriad of applications for the above dry adhesive and its dry self-adhesive and micro-featured and nano-featured surface embodiments. In fact, their commercial and industrial applications are limited only by the imagination. Non-limiting examples of these possible applications will be discussed below.

The applications for dry adhesive are numerous. Non-limiting examples of applications include adhesives backed products, removable adhesives, sewing and craft, straps and strips, lawn and garden, holidays tie-down, button replacement, diaper tabs, stationary and paper arts, memo boards, albums, temporary carpet protection, toys, automotive, electronics, construction, industrial adhesive, apparel, footwear, display, packaging, material handling, military, health care, agriculture, aerospace, sports, recreation, surface protection, sealing, masking tapes, etc.

The dry adhesive (including the dry self-adhesive) may be employed in current applications where conventional adhesive materials and fasteners (such as for example, various glues and hook-and-loop fasteners) are typically used. In fact, the invention is particularly useful in applications requiring blind fasteners (i.e. where holes or similar damage is NOT produced on the objects to be adhered together) are required and/or where a reversible attachment is desired.

In particular, there are very numerous applications for embodiments:
  where the dry self-adhesive is provided with a conventional adhesive backing for adhering the dry self-adhesive to one or more substrates and thus allowing reversibly adhering these various substrates to each other; or
  where the micro-featured and nano-featured surface and the compliant surface are provided with a conventional adhesive backing allowing adhering the compliant surface to a first substrate and the micro-featured and nano-featured surface to a second substrate and reversibly adhering the first substrate to the second substrate.

For example, such embodiments can be used to replace fasteners of the 3M™ Dual Lock™ type and of the Velcro™ (hook and loop) type as well as mounting putty in many of their applications.

Applications include mounting signage or ads or securing panels (for example, on walls), assembling displays, assembling various parts of an object (in industrial manufacturing, in toys, etc.), and mounting/keeping decorative elements in place. Another application is to secure various objects in place at home, at the office and also in space where zero-gravity conditions causes all objects to float if not secured in place.

The invention could be use in clothing and shoes to replace hook-and-loop fasteners, snap-on fasteners, button and even zippers.

Other uses include holding together cables and use as diaper's closures.

Another use is in boards such as advertisement billboards like those on walls and along motor roads. In embodiments, the billboard surface is a micro-featured and nano-featured surface, for example the micro-featured and nano-featured aluminium. A sheet has an ad or another image printed on its front, while its backside bears a layer of compliant material so as to form a compliant surface. In embodiments, the sheet is a plastic sheet. For example, it can be a vinyl sheet such as a PVC sheet, a PET sheet or a sheet made of another polymer. The layer of compliant material may be, in embodiments, from 5 to 50 μm thick. The ad or image can be inkjet printed using solvent or UV based inks. In embodiments, where these inks are pigments and waterfast, it is not necessary to protect the image with an overcoat. In other embodiments, such a protective overcoat is provided. In use, the sheet is attached to the board by dry adhesion, thus no nails, glue or screws are needed. The sheet can be pulled away from the board as needed (e.g. for alignment purposes or for changing the ad).

Yet another use for mounting displays (ads and the like) on glass. In an embodiment, a compliant layer is adhered to one side of the glass by conventional means for example a transparent (preferably invisible) regular adhesive. Then, a micro-featured and nano-featured surface of the display (for example a printed ad) is contacted with the compliant layer to effectively mount the display on the glass. In embodiments, the compliant layer is transparent and the micro-featured and nano-featured surface bears an image that is displayed through the glass. Advantageously, the display is two-sided and bears images for display on both its sides (at least one side of the display having, of course, a micro-featured and nano-featured surface). In this case, both images are visible while the display is invisibly fastened on the glass. The display can be easily be removed and replaced by another display. This would be useful in commercial settings. This could also be a toy for children with the display being pre-made letters or various images. In this case, the display could also be a children's drawing on a substrate with a micro-featured and nano-featured surface (for example inkjet photo paper).

Another application of the dry adhesive is for bulletin boards and similar objects. In an embodiment, a board with a micro-featured and nano-featured surface is provided. Various objects with a compliant surface can be reversibly displayed on the board. Objects with compliant surface can be three-dimensional. They can also be paper or plastic sheets backed with a compliant surface. Both the paper and plastic sheets are writable and/or bear writings and/or images. In an embodiment, the plastic sheets are writable and erasable when used, for example, with dry erase markers.

In a similar embodiment, a board with a compliant surface is provided and objects with a micro-featured and nano-featured surface can be reversibly displayed on it. Objects with micro-featured and nano-featured surface can be three-dimensional. They can also be sheets of various materials. They can be any of the above-described paper sheets with micro-featured and nano-featured surfaces. They can also be plastic or metal sheets with a micro-featured and nano-featured surface such as those discussed above. These can be writable and/or bear writings and/or images or they can be fronted with a substrate that is writable and/or bear writings and/or images (the backside being the micro-featured and nano-featured surface that will adhere to the compliant surface of the board).

In other embodiments, both the board and the objects have a dry self-adhesive surface. The objects may be three-dimensional or they can be sheets of various materials. These can be writable and/or bear writings and/or images or they can be fronted with a substrate that is writable and/or bear writings and/or images (the backside being the dry self-adhesive surface that will adhere to the dry self-adhesive surface of the board).

These boards can be used in a variety of settings. They can be used to display ads, messages, menus in restaurants, or various other notes (for example at home or in a workplace, e.g. an office), etc. In embodiments, the objects are similar to sticky notes.

In embodiments, the board can be an entire wall or a partition wall or board on which various objects (art pieces, ads, posters such as those used in conferences) can be displayed.

The above board and objects can be provided separately or together as a kit. Therefore, the present invention covers them together as well as separately.

In other applications, the dry adhesive may be employed in circuit boards. Various adhesives are typically used when manufacturing circuit boards; these can be, for example, epoxies and tapes. The dry adhesive may replace such materials.

In an embodiment of the invention, there is provided a game or toy comprising the above dry adhesive, including its dry self-adhesive embodiment. The game or toy can be destined to adults, teenagers and/or kids.

In embodiments, the game or toy is a dart game, wherein the micro-featured and nano-featured surface bears an image of a target and wherein the compliant surface is a surface of a tip of a dart, the tip being made of a compliant material.

This game can be played in the same manner as conventional dart games are played. Additionally, the darts can be replaced by projectiles of any suitable form, for example, balls or other. The darts can be thrown by hand or they may be projected from a toy gun such as that for child use or a more effective gun, such as that used for practicing paintball. Therefore, in embodiments, the game or toy of the invention is a game for practicing and improving hand shooting skills and/or gun shooting skills.

In yet other embodiments, the game or toy is a shooting game, wherein the nano- and micro-featured surface is embedded in a piece of clothing, and wherein the compliant surface is a surface of a projectile.

In this game, the projectile may be a dart, a ball or any other suitable projectile. The projectile may be projected from a toy gun such as that for child use or a more effective gun, such as that used for practicing paintball. In embodiments, the clothing is a training jersey, a pair of pants, a helmet, protective eyewear, a suit and the like. For example, the clothing may be a suit such as that worn for practicing paintball. This game can be similar to that marketed by Hasbro™ under the trademark Nerf Dart Tag™.

In other embodiments of the game or toy, the micro-featured and nano-featured surface bears an image missing a part at a location thereof and the compliant surface is on the backside of a substrate bearing an image of the missing part, the game comprising correctly placing the missing part at said location. In embodiments, the image on the micro-featured and nano-featured surface is missing many parts and the compliant surface is on the backside of many substrates each bearing one of these missing parts. In an embodiment, both the surface bearing an image missing one or more part and the surface of the backside of the substrate bearing an image of the missing part are dry self-adhesive surfaces. In these embodiments, both the micro-featured and nano-featured surface and the substrate with a compliant surface on its backside can be replaced by a dry self-adhesive surface. Similar toys can take the form of puzzles or art work.

This game or toy can be a game for very young children to learn the different parts of an object. It can be a puzzle. It can also be a "Pin the Tail on the Donkey" type of game where a player tries to correctly place the missing part(s) on the image on the nano- and micro-featured surface without looking at it.

In other embodiments, the game or toy is a building set where some of parts have a micro-featured and nano-featured and some other parts have a compliant surface and both types of parts are used to build an object, for example a model of a vehicle or a building. In embodiments, some or all of the parts of this building set bear both types of surfaces side by side and/or on various sides thereof. In these embodiments, both the micro-featured and nano-featured surface and the compliant surface can be replaced by a dry self-adhesive surface.

In another embodiment, the game or toy is an art and craft set where some of parts have a nano- and micro-featured surface and some other parts have a compliant surface and both types of parts are used to build an art and craft project. In embodiments, some or all of the parts of this art and craft set bear both types of surfaces side by side and/or on various sides thereof. In these embodiments, both the micro-featured and nano-featured surface and the compliant surface can be replaced by a dry self-adhesive surface.

In other embodiments, the game or toy is a board (or more generally a play surface, or even a book or album) with accompanying cards or objects to be placed on the board, the board bearing on its face one of the nano- and micro-featured surface and the compliant surface and the cards or objects bearing on their backside the other of the nano- and micro-featured surface and the compliant surface. In these embodiments, both the micro-featured and nano-featured surface and the compliant surface can be replaced by dry self-adhesive surfaces.

This board can be portable and used for example on a table or on the floor. The board can also be fixed on a wall. In all cases, the board can bear various images and writings.

In embodiments, the board is replaced by a book or a "sticker" album on which cards and/or objects can be attached and detached as a story is told or as they are collected.

The cards can, for example, bear words or letters. In this case, the board/book can bear lines for placing the words and letters. This toy can thus be used for teaching a child to read. A version with numbers and mathematical operators can be used for teaching mathematics.

The cards can be in the shape of various pieces of clothing and fashion accessories. In this case, the board can bear the image of a figure to be clothed in a dress up game.

The cards can also be puzzle pieces and the board may receive these pieces. This would allow putting the puzzle away when not playing without losing puzzle pieces and without having to put the puzzle pieces in a box. This would also allow hanging the puzzle from a wall.

Instead of or in conjunction with cards, objects can be used on the board. For example, cards with the names of children can be placed on the board and objects in the shape of cars, stars, and the like can be placed next to a child's name, for example, as a reward for good behavior or for succeeding in a task such as a learning task. Alternatively, the board can bear a child schedule and a child figurine (or another card or object representing the child) can be moved on the board according to the time of day. In another embodiment, the board is a game board (e.g. a chess board) with accompanying objects (e.g. chess pieces) that will adhere to the board. This allows playing a game on the board while the board is not supported by a table for example in a car, in a waiting room, etc.

In yet other embodiments, the game is a set or vehicle for playing with figurines (human or other). For example, a garage set for playing with cars, a firefighter truck with firefighters and their equipment, a building set with construction materials and human figurines, a farm set for playing with animal and human figurines, and the like. Various parts of the set and the figurines can have a nano- and micro-featured surface and/or a compliant surface, which allows their dry adhesion. For example, the working end of a crane can have a nano- and micro-featured surface to which mock construction materials with a compliant surface or entirely made of a compliant material can adhere. In another example, an action figure is held down into a toy car through dry adhesion between a nano- and micro-featured surface and a compliant surface. In these embodiments, both the micro-featured and nano-featured surface and the compliant surface can be replaced by a dry self-adhesive surface.

It will be clear to the skilled person that the invention can replace glue, magnets and/or Velcro™ in many instances where they are used in toys and games.

It will also be clear that in many instances above, the nano- and micro-featured surface and the compliant surface can swap position without affecting the working of the game or toy. It will also be clear to the skilled person that in many instances the nano- and micro-featured surface and the compliant surface can both be replaced by dry self-adhesive surfaces even when it is not explicitly mentioned. The present application intends to cover such variations.

Herein, "about" has its usual meaning. It can, for example, mean more or less 5% of the numerical value qualified by this term.

Herein, "comprising" is an open-ended term meaning "including, but not being limited to".

Other objects, advantages and features of the present invention will become more apparent upon reading of the following non-restrictive description of specific embodiments thereof, given by way of example only with reference to the accompanying drawings.

DESCRIPTION OF ILLUSTRATIVE EMBODIMENTS

The present invention is illustrated in further details by the following non-limiting examples.

Examples 1 to 5

Micro-Featured and Nano-Featured Surfaces

The surface of aluminum sheets of a thickness of about 0.30 mm were treated according to process 200 as described above using various conditions. These different process conditions are shown in Table III below.

TABLE III

| Processing Steps | Conditions | \multicolumn{5}{c}{EXAMPLES} | | | | |
|---|---|---|---|---|---|---|
| | | 1 | 2 | 3 | 4 | 5 |
| Degreasing | NaOH and sodium gluconate | Yes | Yes | Yes | Yes | Yes |
| Mechanical Graining | Nylon brush & pumice stone powder | No | No | Yes | No | Yes |
| Electrolytic Graining (C/dm²) | HCl (6.00 g/L) | 1,000 | | | | |
| | HCl (8.00 g/L) & CH$_3$COOH (16.0 g/L) | | 1,250 | 270 | | 276 |
| | HNO$_3$ (10 g/L) | | | | 160 | |
| Anodization (A/dm²) | H$_2$SO$_4$ (140 g/L) | 5.60 | 5.60 | | 5.60 | 5.60 |
| | H$_3$PO$_4$ (160 g/L) | | | 7.00 | | |
| Functionalization | NaH$_2$PO$_4$ (50.0 g/L) & NaF (0.80 g/L) | Yes | Yes | | | Yes |
| | Vinyl phosphoric and acrylic copolymer (0.30 g/L) | | | Yes | | |
| Oxide weight (g/m²) | | | 2.70 | 1.80 | 2.70 | 2.20 |
| R$_a$ (μm) | | 0.65 | 0.52 | 0.27 | 0.42 | 0.60 |
| RS$_m$ (nm) | | 24 | 26 | 220 | 44 | 200 |

In Example 1, the surface of the aluminum sheet was pre-treated by degreasing, micro-featured by electrolytic graining in a 6.0 g/L HCl solution with 1,000 C/dm² of alternating current density, nano-featured by electrolytic anodization in a 140 g/L H$_2$SO$_4$ solution with 5.60 A/dm² of direct current density, and functionalized with a 50.0 g/L NaH$_2$PO$_4$ and 0.80 g/L NaF solution. FIG. 1 shows a scanning electron micrograph (SEM) of the treated aluminum substrate where the micro-features and nano-features selectively created on the aluminum surface are visible. For this surface, the R$_a$ is 0.65 μm and the RS$_m$ is 24 nm.

Figure 2:
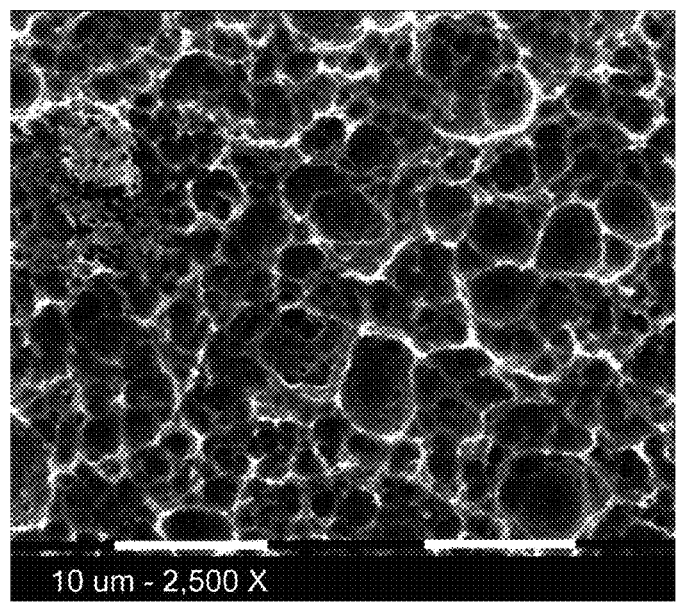
FIG. 2 is a scanning electron micrograph (SEM) of a micro-featured and nano-featured aluminum surface according to Example 2.

In Example 2, the surface of the aluminum sheet was pre-treated by degreasing, micro-featured by electrolytic graining in a 8.0 g/L HCl and 16.0 g/L CH$_3$COOH solution with 1,250 C/dm² of alternating current density, nano-featured by electrolytic anodization in a 140 g/L H$_2$SO$_4$ solution with 5.60 A/dm² of direct current density, and functionalized with a 50.0 g/L NaH$_2$PO$_4$ and 0.80 g/L NaF solution. FIG. 2 shows a scanning electron micrograph (SEM) of the treated aluminum substrate where the micro-features and nano-features selectively created are visible. For this surface, the R$_a$ is 0.52 μm and the RS$_m$ is 26 nm. The oxide weight is 2.70 g/m².

Figure 3:
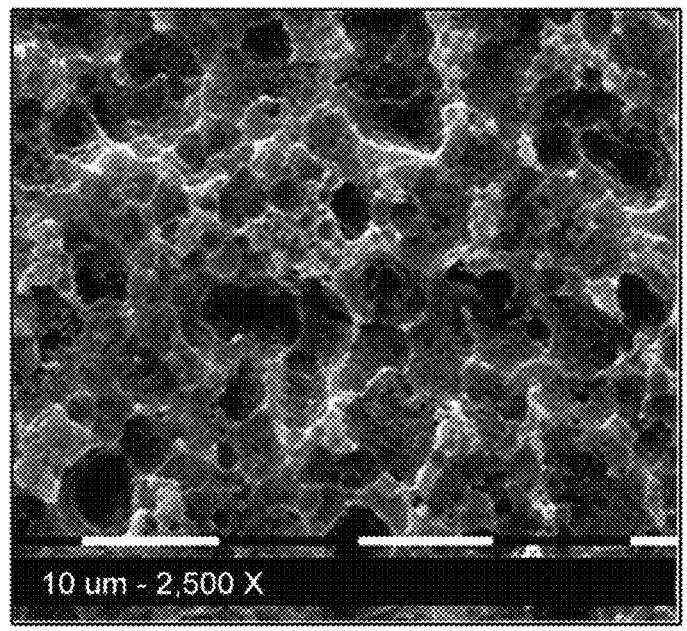
FIG. 3 is a scanning electron micrograph (SEM) of a micro-featured and nano-featured aluminum surface according to Example 3.

In Example 3, the surface of the aluminum sheet was pre-treated by degreasing, micro-featured by mechanical graining and by electrolytic graining in a 8.0 g/L HCl and 16.0 g/L CH$_3$COOH solution with 270 C/dm² of alternating current density, nano-featured by electrolytic anodization in 160 g/L H$_3$PO$_4$ solution with 7.0 A/dm² of direct current density, and functionalized with a 0.30 g/L vinyl phosphoric and acrylic copolymer solution. FIG. 3 shows a scanning electron micrograph (SEM) of the treated substrate where the micro-features and nano-features selectively created are visible. For this substrate, the $R_a$ is 0.27 μm and the $RS_m$ is 220 nm. The oxide weight is 1.80 g/m².

Figure 4:
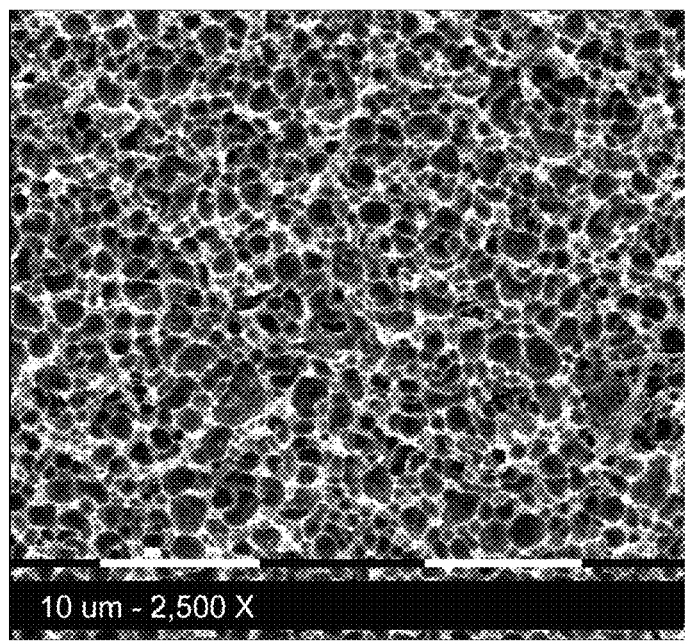
FIG. 4 is a scanning electron micrograph (SEM) of a micro-featured and nano-featured aluminum surface according to Example 4.

In Example 4, the surface of the aluminum sheet was pre-treated by degreasing, micro-featured by electrolytic graining in 10.0 g/L $HNO_3$ solution with 160 C/dm² of alternating current density, nano-featured by electrolytic anodization in 140 g/L $H_2SO_4$ solution with 5.6 A/dm² of direct current density. FIG. 4 shows a scanning electron micrograph (SEM) of the treated substrate where the micro-features and nano-features selectively created are visible. For this substrate, the $R_a$ is 0.42 μm and the $RS_m$ is 44 nm. The oxide weight is 2.70 g/m².

In Example 5, the surface of the aluminum sheet was pre-treated by degreasing, micro-featured by mechanical graining and by electrolytic graining in a 8.0 g/L HCl and 16.0 g/L $CH_3COOH$ solution with 276 C/dm² of alternating current density, nano-featured by electrolytic anodization in a 140 g/L $H_2SO_4$ solution with 5.6 A/dm² of direct current density, and functionalized with a 50.0 g/L $NaH_2PO_4$ and 0.80 g/L NaF solution. For this treated substrate, $R_a$ is 0.60 μm and $RS_m$ is 200 nm. The oxide weight is 2.20 g/m².

Example 6

Micro-Featured and Nano-Featured Surface

Figure 5:
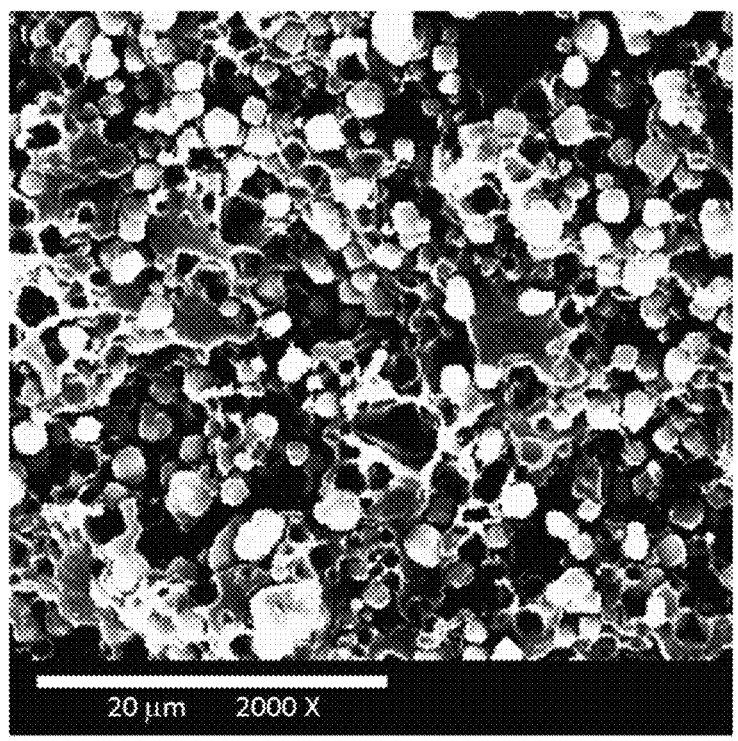
FIG. 5 is a scanning electron micrograph (SEM) of a micro-featured and nano-featured polyethylene terephthalate surface according to Example 6.

A biaxially oriented polyethylene terephthalate film (PET) having a thickness of 30 μm and containing 30% Zeolite A (mean particle size 1.0 μm) and 5% calcium carbonate (mean particle size 2.0 μm) was extruded 260° C. from a twin screw extruder. It was then stretched to a 3:1 ratio at 130° C. The stretched film was then dipped in a 2M hydrochloric acid solution at 40° C. for 24 hours to partially dissolve the calcium carbonate, which created micropores on the surface. The treated film was then washed with water and dried in a hot air oven at 110° C. It was then dipped in an aqueous polymeric solution containing 5% of silica colloid particles (Ludox HS40 and Ludox SK, available from Dupont, USA), and then dried in a hot air oven at 120° C. This created nanopores on the surface. For this surface, the $R_a$ is about 0.50 μm and $RS_m$ is 400 nm. FIG. 5 shows a scanning electron micrograph of the treated PET film.

Observations Concerning Examples 1 to 6

Treated surfaces according to the invention, including those of Examples 1 to 6, were tested. Donut-shaped objects and thread-like objects made of a compliant material (KRATON® D1161 B Polymer) were used. These objects were non-tacky; they did not adhere to the hands of the user. The treated surfaces were also non-tacky; the user could easily rub them without feeling any tackiness.

When placed or thrown on the treated surfaces, the compliant objects adhered to them. The adhesion was sufficiently strong to allow moving the treated surfaces (turning them on their side, placing them upside-down, facedown, etc.) without the objects falling down. It was necessary to pull on of the objects to get them off the treated surfaces. In some cases, a significant force had to be applied for the compliant object to become separated from the treated surface.

In most cases, the compliant objects did not leave any residue on the treated surfaces when separated from it. In a few case, a very slight imprint was visible on the treated surfaces.

Figure 15:
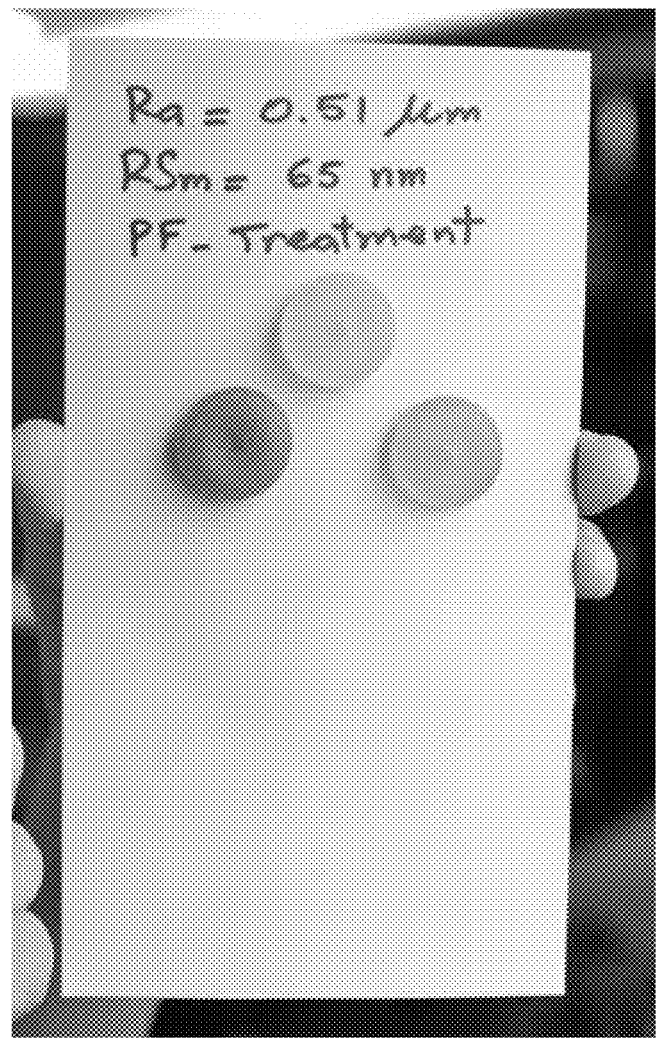
FIG. 15 is a photograph showing the adhesion of three donut-shaped objects made of a compliant material on a vertically held substrate with a micro-featured and nano-featured surface according to the invention.
Figure 16:
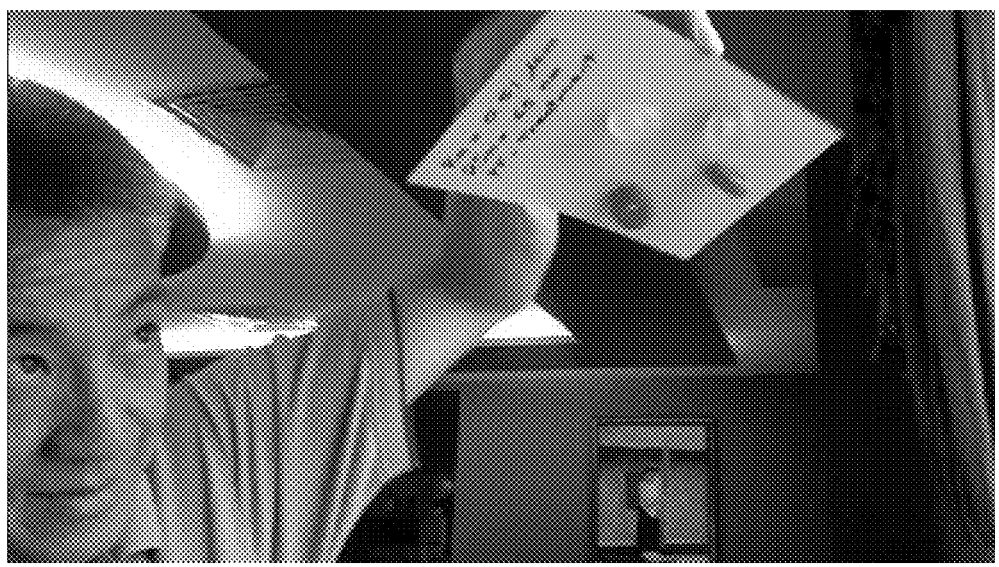
FIG. 16 is a photograph showing the adhesion of four donut-shaped objects made of a compliant material on the same substrate as FIG. 15, but held facedown.

FIG. 15 is a picture showing three compliant donut-shaped objects adhering to a vertically held aluminum substrate with a surface according to the invention. This surface had a $R_a$ of 0.51 μm and a $RS_m$ of 65 nm and had been functionalized with phosphate fluoride (PF). FIG. 16 is a photograph showing the adhesion of four donut-shaped objects made of a compliant material on the same substrate as FIG. 15. This time, the substrate is held facedown. It can be seen that the objects did not fall.

Figure 17:
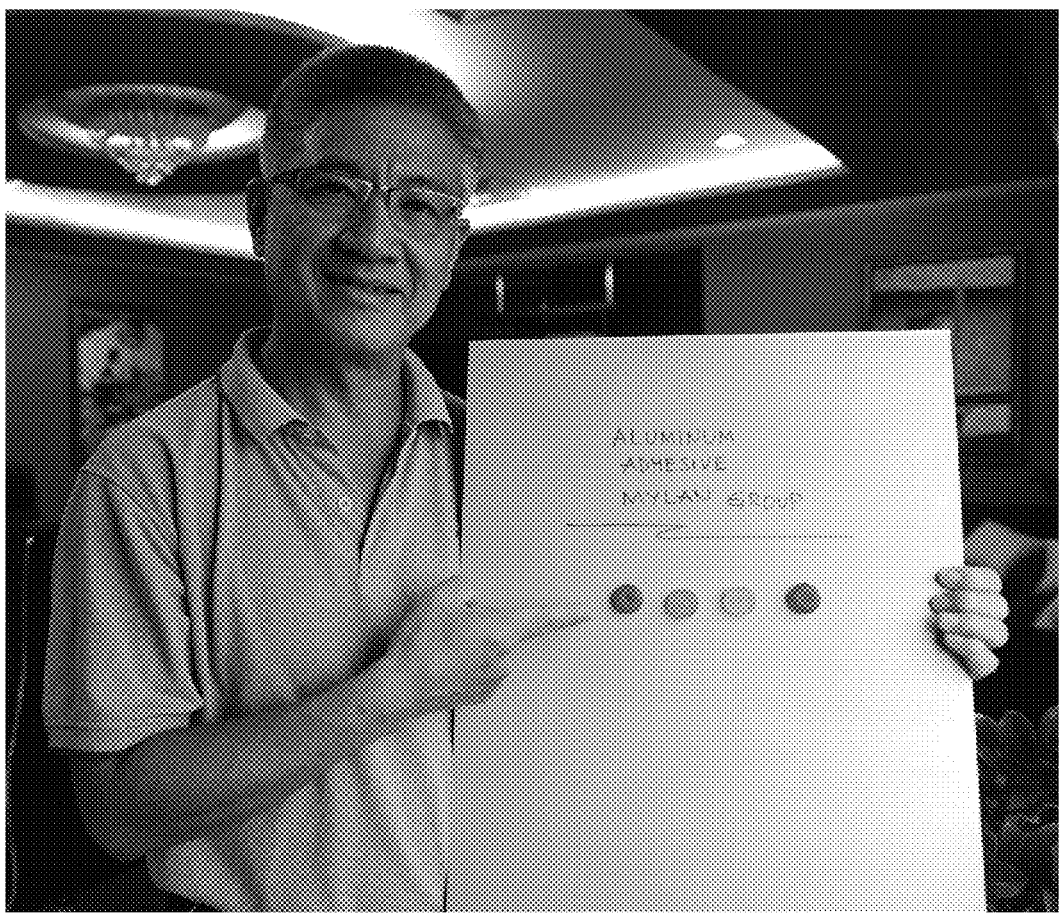
FIG. 17 is a photograph showing the adhesion of four donut-shaped objects made of a compliant material on another substrate with a micro-featured and nano-featured surface according to the invention.
Figure 18:
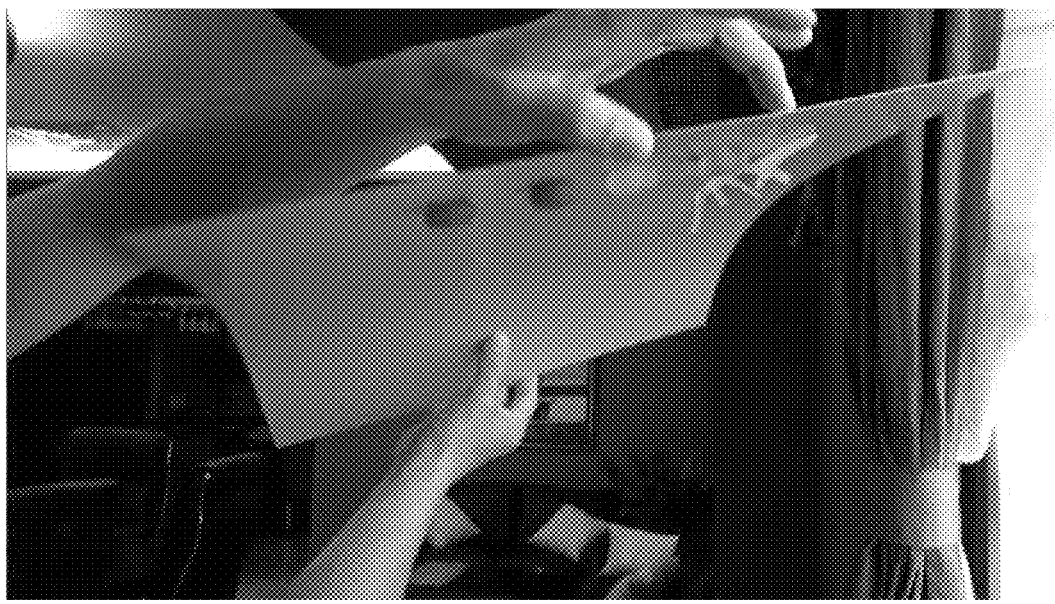
FIG. 18 is a photograph showing the adhesion of four donut-shaped and one thread-like objects made of a compliant material on the same substrate as FIG. 17, but held facedown.

FIG. 17 is a photograph showing the adhesion of four donut-shaped objects made of a compliant material on another aluminum substrate with a surface according to the invention. FIG. 18 is a photograph showing the adhesion of the same four donut-shaped objects as well as one thread-like object made of a compliant material on the same substrate as FIG. 17. This time, the substrate is held face-down. It can be seen that the objects did not fall.

Figure 19:
FIG. 19 is a photograph showing the adhesion of four donut-shaped objects made of a compliant material on another vertically held substrate with a micro-featured and nano-featured surface according Example 6.
Figure 20:
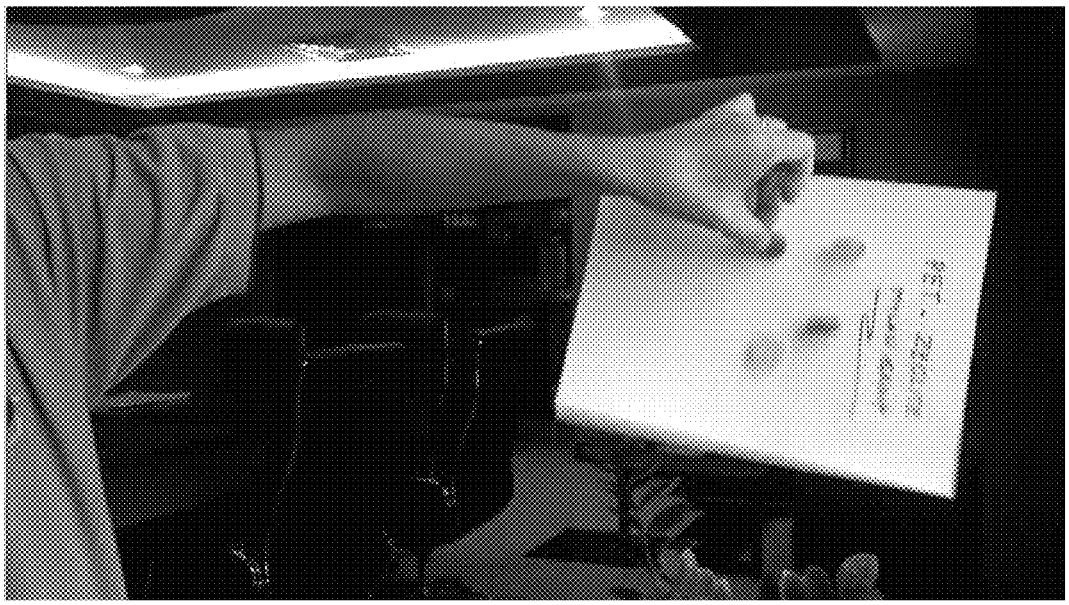
FIG. 20 is a photograph showing the substrate of FIG. 19 bearing four donut-shaped objects can be supported by holding one of the objects.
Figure 21:
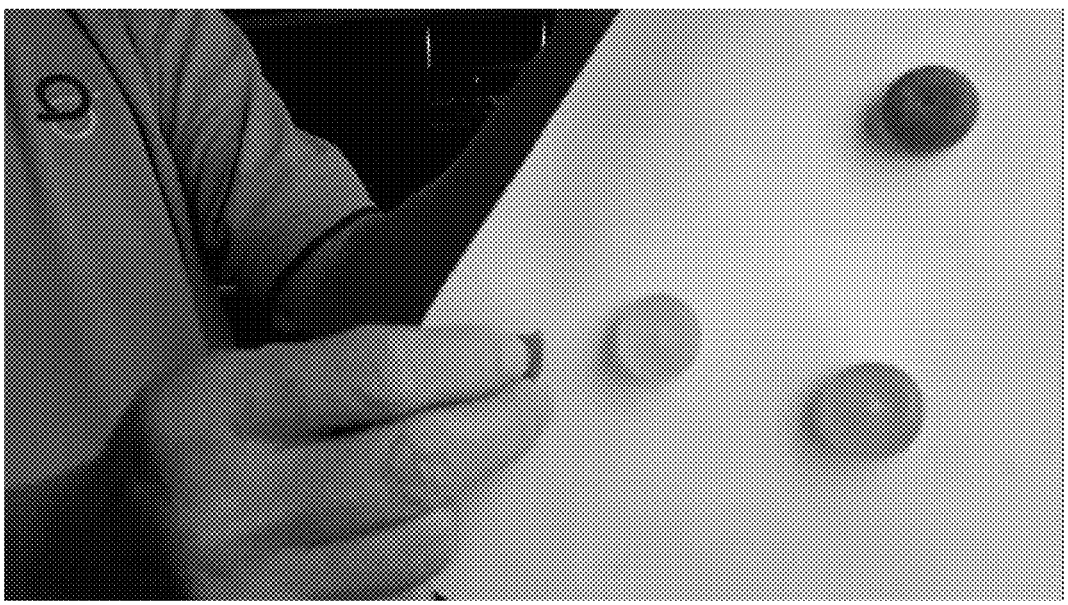
FIG. 21 is a photograph showing one of the inventors pulling to remove one of the four donut-shaped objects from the surface of the substrate of FIGS. 19 and 20.

FIG. 19 is a photograph showing the adhesion of four donut-shaped objects made of a compliant material on a vertically held substrate with a surface according to the invention. This substrate was the PET substrate incorporating zeolite described in Example 6 above. FIG. 20 is a photograph showing that the substrate of FIG. 19 bearing four donut-shaped objects can be supported by holding only one of the donut-shaped objects. Even when shaking, the surface remained adhered to the held object. FIG. 21 is a photograph showing one of the inventors pulling on an object to remove it from the substrate of FIGS. 19 and 20. It was necessary to pull the objects; otherwise they would remain adhered to the surface.

Figure 22:
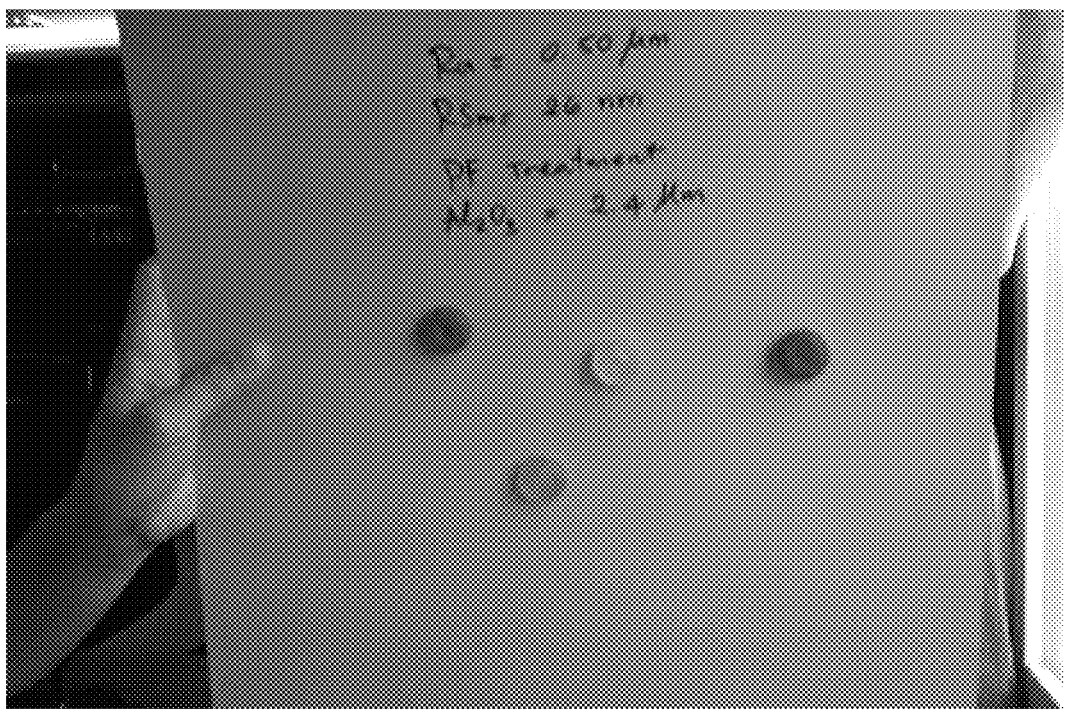
FIG. 22 is a photograph showing the adhesion of four donut-shaped objects made of a compliant material on another vertically held substrate with a micro-featured and nano-featured surface according to the invention.

FIG. 22 is a photograph showing the adhesion of four donut-shaped objects made of a compliant material on another vertically held substrate with a surface according to the invention. This was an aluminum surface with $R_a$=0.50 μm, $RS_m$=26 nm, a phosphate fluoride treatment and an aluminum oxide layer of 2.4 μm.

Videos (#12052011018, 12052011019, 12052011020, 12052011021, 12052011022, and 12052011023) of some tests on various substrates with surfaces according to the invention were made.

Comparative Example 1

It was observed that the compliant objects did not adhere at all to the (untreated) backsides of the treated surfaces of Examples 1 to 6.

The compliant objects did not adhere to an aluminum surface comprising micropores only, which was prepared by graining and sand blasting techniques. Similarly, the compliant objects did not adhere to an aluminum surface comprising nanopores only, which was prepared by anodization.

Example 7

Self-Adhesive

An anodized aluminum sheet (size 20 cm×30 cm, thickness of 0.15 mm) comprising micro-features and nano-features ($R_a$ 0.25 μm and $RS_m$ 26 nm) was provided in accordance with the above. The sheet was dipped into an ethanol solution containing 5 g/L of triethoxysilane and a trace of hydrochloric acid at room temperature. The sheet was then dried in a hot air oven at 80° C. for 3 minutes. A heat curable silicone elastomer composition (QLE1031, available from Quantum Silicones, Virginia, USA) was screen printed on the treated aluminum sheet to form a pattern of round dots having a diameter about 2.0 mm. The spacing between the round dots was about 4.0 mm. The sheet was then cured at 150° C. for 20 minutes in a hot air oven to produce surface tack-free silicone compliant dots having a thickness of about 30 µm and which strongly adhered to the porous aluminum sheet. The hardness of the silicone compliant dots was measured and was found to be about 25 Shore-A.

A second aluminum sheet was prepared in a similar way. The first and second aluminum sheets were pressed face-to-face. They strongly adhered to each other and could be peeled apart without damaging them, i.e. without delaminating the silicone compliant dots.

Example 8

Self-Adhesive

An anodized aluminum sheet (the same as in Example 7) was used. Half of it was left as is while the other half was screen printed with a solution of ethylene-butadiene-styrene elastomer (hardness 27 Shore-A, available from Mylan Group, Travinh, Vietnam) in toluene to form a pattern of round dots. A 110 mesh screen was used to produce dots of about 790 micrometers with spacing of about 870 micrometers. It was then dried using hot air at 80° C.

Both halves of the dry self-adhesive aluminum sheet thus produced were cut apart and placed face to face. The halves adhered very well to one another. They were subsequently peeled apart without delaminating the compliant dots. This adhering/peeling process was repeated several times with good adhesion and easy peeling.

Figure 23:
FIG. 23 (A to F) shows the use of a dry self-adhesive sheet according to Example 8.
Figure 23:
Figure 23:
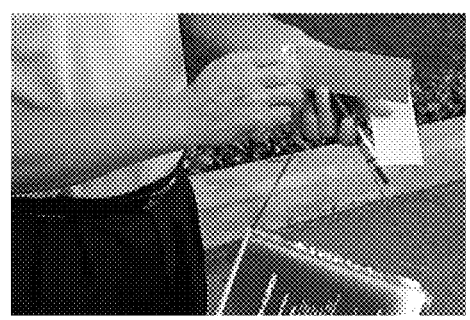
Figure 23:
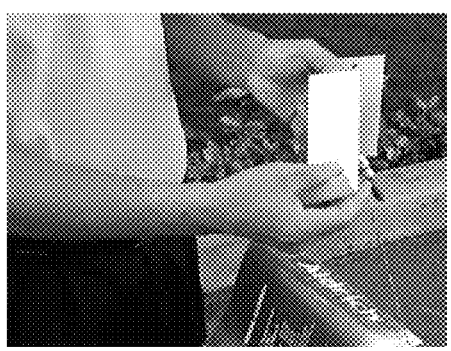
Figure 23:
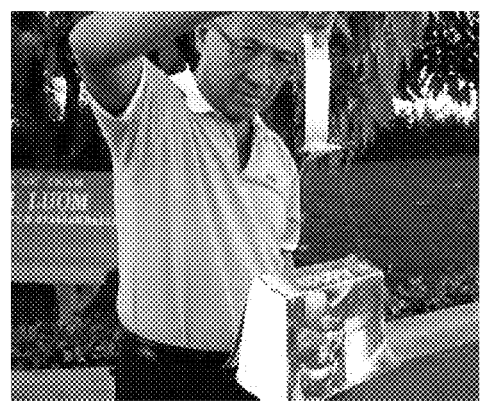
Figure 23:

FIG. 23 (A to F) shows static images drawn from a video (MVI_9987). They show various steps of a test of the dry adhesive aluminum sheet. The dry adhesive aluminum sheet is shown in FIG. 23A. It was non-tacky; for example the experimenter could easily rub his fingers on it. The top part of the sheet was non-porous, while the bottom part was porous, i.e not coated with the elastomer. Both halves were cut apart as shown in FIG. 23B. A part of one of the halves was folded to produce a make-shift hook in FIG. 23C. Both halves were placed face to face as shown in FIG. 23D. The adhesion was so good that a heavy Aldrich catalog could be supported by the half with the makeshift hook while holding only the other half (see FIG. 23E). Finally, both halves were easily pulled apart as shown in FIG. 23F. This process was repeated several times with the same good success.

Example 9

Self-Adhesive

A dry self-adhesive sheet having a surface comprising porous areas and compliant areas was prepared by screen printing a heat curable silicone elastomer composition (QLE1031, available from Quantum Silicones, Virginia, USA) on an inkjet photo paper (Ultra Premium Photo Paper Glossy, available from Epson) to form a pattern of round dots having a diameter of about 2.0 mm. The spacing between the round dots was about 4.0 mm. The sheet was then cured at 150° C. for 20 minutes in a hot air oven to produce surface tack-free silicone compliant dots having a thickness of about 30 µm that strongly adhered to the porous paper sheet. The hardness of the silicone compliant dots was measured at about 25 Shore-A.

A second paper sheet was prepared in the same way. The first and second dry adhesive sheets were pressed face-to-face. They strongly adhered to each other and could be peeled apart without delaminating the silicone compliant dots.

Figure 24:
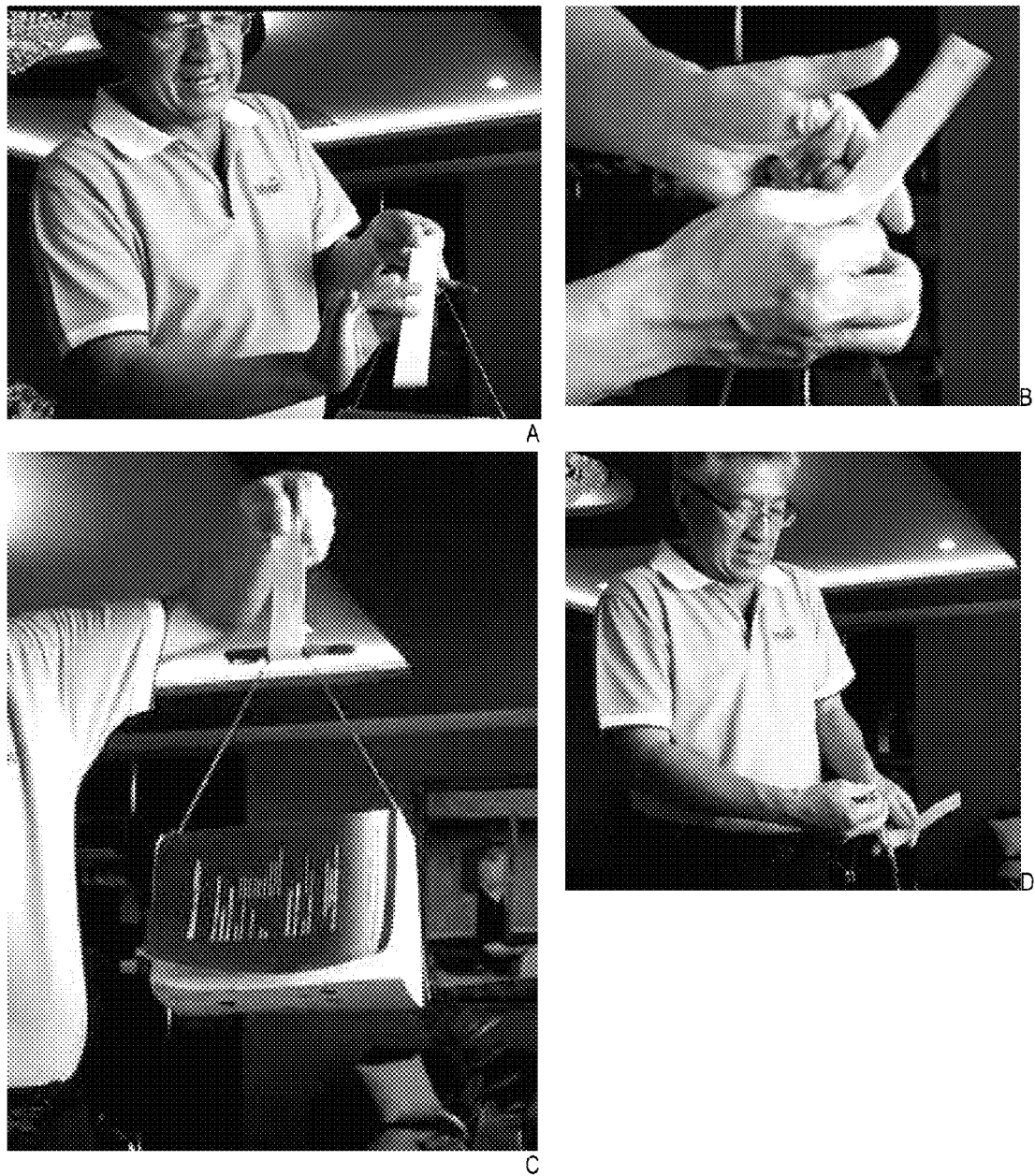
FIG. 24 (A to D) shows the use of a dry self-adhesive sheet according to Example 9.

FIG. 24 (A to D) shows static images drawn from a video (MVI_9982). They show various steps of a test of the dry adhesive sheet. The dry adhesive sheet was non-tacky and the experimenter could easily rub his fingers on it (FIG. 24A). The sheet was folded around a pen and a cord holding a heavy Aldrich catalog and partly folded onto itself as shown in FIG. 24B. The adhesion was so good that the heavy Aldrich catalog could be supported by the folded sheet while the experimenter only held one side of the folded sheet (see FIG. 24C). Finally, the sheet was easily unfolded (see FIG. 24D). This process was repeated several times with the same good success.

Example 10

Self-Adhesives

A dry self-adhesive sheet having a surface comprising porous areas and compliant areas was prepared by screen printing a toluene solution containing an ethylene-butadiene-styrene elastomer (harness 27 Shore-A, available from Mylan Group, Travinh, Vietnam) on an inkjet photo paper (Ultra Premium Photo Paper Glossy, available from Epson) to form a pattern of round dots. A 110 mesh screen was used to produce dots of about 790 micrometers with spacing of about 870 micrometers. The sheet was then dried using hot air at 80° C.

A second dry self-adhesive sheet was prepared in the same way. The first and second dry adhesive sheets were pressed face-to-face. They strongly adhered to each other and could be peeled a part without delaminating the silicone compliant dots.

Figure 25:
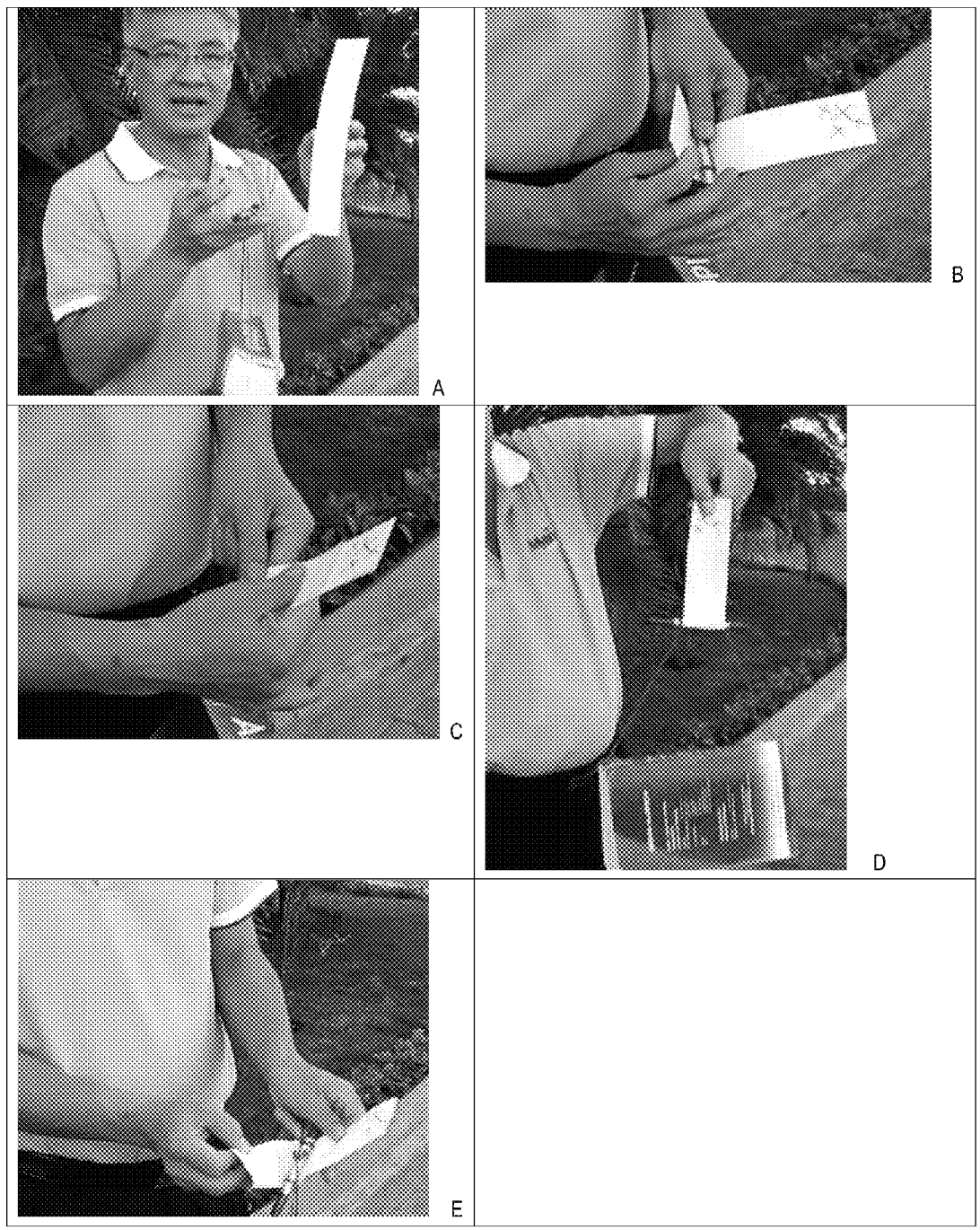
FIG. 25 (A to E) shows the use of a dry self-adhesive sheet according to Example 10.

FIG. 25 (A to E) shows static images drawn from a video (MVI_9984). They show various steps of a test of the dry adhesive sheet. The dry adhesive sheet (FIG. 25A) was non-tacky and the experimenter could easily rub his fingers on it. The sheet was folded around a pen and a cord holding a heavy Aldrich catalog and partly folded onto itself as shown in FIGS. 25B and C. The adhesion was so good that the heavy Aldrich catalog could be supported by the folded sheet while the experimenter only held one side of the folded sheet (see FIG. 25D). Finally, the sheet was easily unfolded (see FIG. 25E). This process was repeated several times with the same good success.

Example 11

Self-Adhesives

A polysulfone membrane sheet (pore size 0.45 µm, thickness of 200 µm, available Sigma Aldrich, Ontario, Canada) was screen printed to form a pattern of square dots with an aqueous composition containing 35% of polyvinyl alcohol (Celvol 523, available from Air Products, USA), 60% of alumina particles (Cab-O-Sperse PG008, available from Cabot, USA) and 5% of boric acid. The sheet was then dried with a hot air at 80° C. Then a toluene solution containing an ethylene-butadiene-styrene elastomer (hardness 27 Shore-A, available from Mylan Group, Travinh, Vietnam) was screen printed to form a pattern of round dots on the surface of the previously printed polysulfone membrane without overlapping with the square dots. A 110 mesh screen was used to produce dots of about 790 micrometers with spacing of about 870 micrometers. The sheet was then dried using hot air at 80° C. The porous square dots and non-tacky compliant round dots adhered very well to the polysulfone membrane sheet.

A second polysulfone membrane sheet was prepared in the same way. These two printed sheets adhered very well to each other when placed face-to-face. They were also easily peeled apart without delaminating the square and round dots.

Examples 12-14

Laminating Films

Table IV shows the raw materials employed in Examples 12-14.

| | |
|---|---|
| Elasto-100A | A mixture of low and high molecular weight aminopropyl terminated siloxane dimethyl polymers, available from Mylan Group, Travinh, Vietnam. MW 10,000 g/mol |
| Elasto-100B | A mixture of di-isocyanate and poly-isocyanate compounds, available from Mylan Group, Travinh, Vietnam. |
| Sabic BC112 | Polyethylene terephthalate resin, available from Saudi Basic Industries Corporation, Kingdom of Saudi Arabia. |
| Tinuvin 360 | Ultraviolet absorber, available from BASF, Germany. |
| Admer QF551E | Polyethylene resin modified with anhydride functional group, available from Mitsui Chemicals, Tokyo, Japan |
| PET-360 | A two layers plastic film comprising a 50 μm polyethylene terephthalate layer (97% Sabic BC112 and 3% Tinuvin 360) and a 20 μm anhydride functionalized polyethylene (Admer QF5551) layer, which were co-extruded on a Reifenhauser thermoforming line, available from Mylan Optoelectronics, Travinh, Vietnam. |
| Kraton D1161 | Styrene-butadiene-styrene copolymer, available under trade name Kraton D1161 from Kraton Polymers, Houston, TX 77032 |

Example 12

A polyethylene terephthalate (PET) laminating film was produced by coating a mixture of Elasto-100A (80% by weight) and Elasto-100B (20% by weight) on a PET-360 substrate using a wire-wound rod coating station on a coating line (Model Combi-Horizontal, available from Nordmeccanica SPA, Piacenza, Italy) at a speed of 100 meter per minute. The coated film was cured using hot air at 120° C. to give an excellent clarity PET-based laminating film bearing a 20 μm tack-free elastomeric layer. The hardness of this compliant layer was measured to be 32 Shore A. The resulting PET laminating film adhered very well when laminated at room temperature on a printed sheet of Epson™ Ultra Premium Photo Paper Glossy.

Example 13

A polyethylene terephthalate laminating film was produced similarly to Example 1 with a different ratio between Elasto-100A (65% by weight) and Elasto-100B (35% by weight) to give an excellent clarity PET-based laminating film bearing a 20 μm tack-free elastomeric layer. The hardness of this compliant layer was measured to be 43 Shore A. The resulting PET laminating film adhered very well when laminated at room temperature on a printed sheet of Epson™ Ultra Premium Photo Paper Glossy.

Example 14

A polyethylene terephthalate laminating film was produced by extruding a Kraton D1161 copolymer at 175° C. onto a PET-360 substrate using an extrusion laminating line (Lamicor, available from Reifenhauser, Troisdorf, Germany). This produced an excellent clarity PET-based laminating film with a 20 μm tack-free elastomeric layer. The hardness of the compliant layer was measured to be 37 Shore A. The resulting PET laminating film adhered very well when laminated at room temperature on a printed sheet of Epson™ Ultra Premium Photo Paper Glossy.

Example 15

Dart Board and Darts

A dart board was produced by creating micro-features and nano-features on an aluminum sheet and then printing a target on the sheet. Darts were made by placing a cap made of a compliant material (Kraton D1163) on the end of a foam stick.

Figure 26:
FIG. 26 (A to D) shows the use of a dart board and darts according to an embodiment of the invention.
Figure 26:
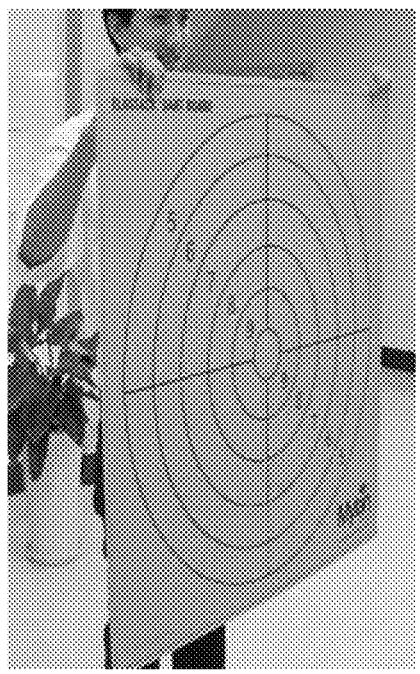
Figure 26:
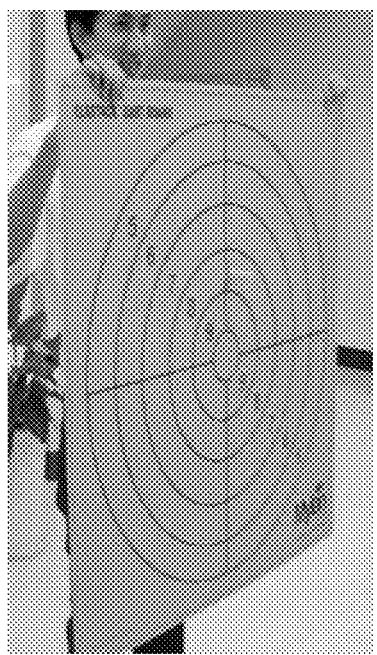
Figure 26:
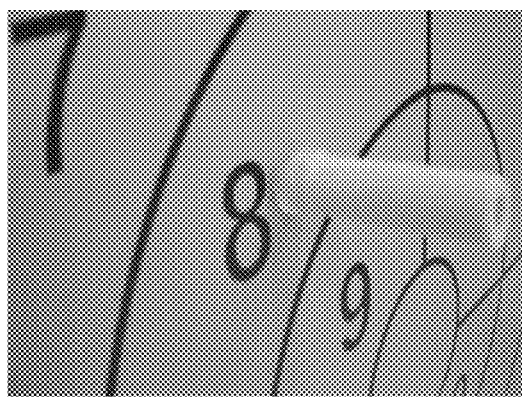
Figure 27:
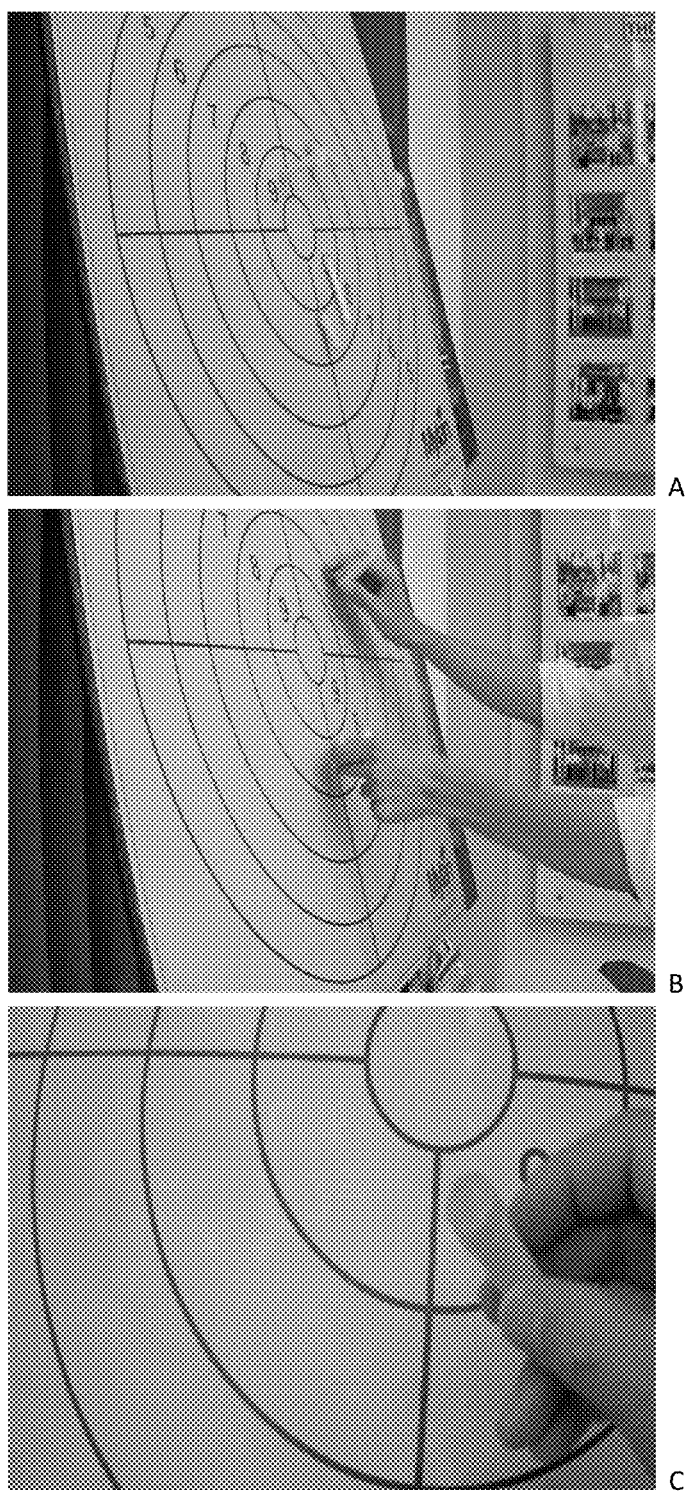
FIG. 27 (A to C) shows the use of a dart board and darts according to an embodiment of the invention.

FIG. 26 shows static images drawn from a video (DSCN4637). FIG. 27 shows static images drawn from other similar video (DSCN4639).

These figures show the use of the above dart board and associated darts. In FIG. 26A, a person is holding the dart board, the backside of which is visible. In FIG. 26B, the front side of the dart board is shown. In FIG. 26C, a dart has been thrown and is now stuck on the dart board. FIG. 26D shows a close up of a dart stuck on the dart board. The dart could easily be removed from the dart board.

In FIG. 27A, four (4) darts are stuck on the dart board after being thrown; the dart board is held by a support. In FIG. 27B, a person easily removes the four darts. FIG. 27C is a close up view of a dart shown the compliant cap on the end of the foam stick.

Although the present invention has been described hereinabove by way of specific embodiments thereof, it can be modified, without departing from the spirit and nature of the subject invention as defined in the appended claims.

The invention claimed is:

1. A dry self-adhesive surface comprising at least two areas, wherein:
   a. at least one of said areas of the dry self-adhesive surface is a non-tacky micro-featured and nano-featured area, said micro-featured and nano-featured areas having micropores and nanopores, wherein said micropores and nanopores define a roughness average in amplitude ($R_a$) between about 0.2 μm and about 3.0 μm with a mean spacing of profile irregularities ($RS_m$) between about 20 nm and about 2000 nm, and
   b. at least one other of said areas of the dry self-adhesive surface is a non-tacky compliant area having a hardness of about 60 Shore A or less,
the micro-featured and nano-featured area and the compliant area being capable of forming upon contact a dry adhesive bond with each other in which the compliant area conforms with the topography of the microporous and nano-porous area resulting in a reversible interlock of the compliant area in the micropores and nanopores of said micro-featured and nano-featured area.

2. The dry self-adhesive surface of claim 1, wherein said compliant area is deposited on part of a micro-featured and nano-featured surface forming exposed micro-featured and nano-featured surfaces and compliant areas, the micro-featured and nano-featured area being provided by the part of the exposed micro-featured and nano-featured surface that is free from the compliant area.

3. The dry self-adhesive surface of claim 2, comprising multiple discrete compliant areas spaced apart on the micro-featured and nano-featured surface.

4. The dry self-adhesive surface of claim 3, wherein the ratio of the total area occupied by the compliant areas to the total area occupied by the micro-featured and nano-featured surface in the spaces between the compliant areas is 1:1.1 or more.

5. The dry self-adhesive surface of claim 2, wherein the micro-featured and nano-featured surface is a metallic surface, a paper surface, or a polymeric surface.

6. The dry self-adhesive surface of claim 1, wherein said micro-featured and nano-featured area is deposited on part of a compliant surface forming exposed compliant ares and micro-featured and nano-featured surfaces, the compliant area being provided by the part of the exposed compliant surface that is free from the micro-featured and nano-featured area.

7. The dry self-adhesive surface of claim 3, comprising multiple discrete micro-featured and nano-featured areas spaced apart on the compliant surface.

8. The dry self-adhesive surface of claim 7, wherein the ratio of the total area occupied by the micro-featured and nano-featured areas to the total area occupied by the compliant surface in the spaces between the micro-featured and nano-featured areas is 1:1.1 or more.

9. The dry self-adhesive surface of claim 1, comprising one or more micro-featured and nano-featured area(s) and one or more compliant area(s) deposited on a surface of a support.

10. The dry self-adhesive surface of claim 9, wherein the surface of the support is a plastic surface, a metal surface, or a paper surface that is optionally backed by a plastic layer.

11. The dry self-adhesive surface of claim 10, wherein the plastic surface is a PET film.

12. The dry self-adhesive surface of claim 1, wherein the compliant area comprises a polymer.

13. The dry self-adhesive surface of claim 12, wherein the polymer comprised in the compliant area is a thermoplastic elastomer or a crosslinked elastomer.

14. The dry self-adhesive surface of claim 12, wherein the polymer comprised in the compliant area is a silicone elastomer, a styrene-isoprene elastomer, a styrene-butadiene elastomer, a styrene-ethylene/butylene-styrene elastomer, a styrene-ethylene/propylene-styrene elastomer, an ethylene-butadiene-styrene elastomer, a siloxane polymer, or a polyisocyanate.

15. The dry self-adhesive surface of claim 1, comprising multiple micro-featured and nano-featured areas and multiple compliant surface areas.

16. The dry self-adhesive surface of claim 15, wherein the areas range(s) in size from about 1 μm to about 5 mm.

17. The dry self-adhesive surface of claim 1, wherein the micro-featured and nano-featured area(s) has a mean spacing of profile irregularities ($RS_m$) between about 20 nm and about 1500 nm.

18. The dry self-adhesive surface of claim 17, wherein the micro-featured and nano-featured area(s) has a mean spacing of profile irregularities ($RS_m$) between about 20 nm and about 1000 nm.

19. The dry self-adhesive surface of claim 18, wherein the micro-featured and nano-featured area(s) has a mean spacing of profile irregularities ($RS_m$) between about 20 nm and about 500 nm.

20. The dry self-adhesive surface of claim 1, wherein the micro-featured and nano-featured area(s) has a roughness average in amplitude ($R_a$) ranging between about 0.2 μm and about 1.5 μm.

21. The dry self-adhesive surface of claim 20, wherein the micro-featured and nano-featured area(s) has a roughness average in amplitude ($R_a$) ranging between about 0.25 μm and about 1.5 μm.

22. The dry self-adhesive surface of claim 20, wherein the micro-featured and nano-featured area(s) has a roughness average in amplitude ($R_a$) ranging between about 0.2 μm and about 0.7 μm.

23. The dry self-adhesive surface of claim 1, wherein the compliant area has a hardness of about 50 Shore A or less.

24. The dry self-adhesive surface of claim 23, wherein the compliant area has a hardness of about 40 Shore A or less.

25. The dry self-adhesive surface of claim 24, wherein the compliant area has a hardness of about 30 Shore A or less.

* * * * *